(12) United States Patent
Hotelling

(10) Patent No.: US 9,360,967 B2
(45) Date of Patent: Jun. 7, 2016

(54) MUTUAL CAPACITANCE TOUCH SENSING DEVICE

(75) Inventor: Steve Hotelling, San Jose, CA (US)

(73) Assignee: Apple Inc., Cupertino, CA (US)

( * ) Notice: Subject to any disclaimer, the term of this patent is extended or adjusted under 35 U.S.C. 154(b) by 1653 days.

(21) Appl. No.: 11/482,286

(22) Filed: Jul. 6, 2006

(65) Prior Publication Data

US 2008/0006453 A1   Jan. 10, 2008

(51) Int. Cl.
*G06F 3/044* (2006.01)

(52) U.S. Cl.
CPC ..................................... *G06F 3/044* (2013.01)

(58) Field of Classification Search
CPC .......... G06F 3/044; G06F 2203/04104; G06F 2203/04106; G06F 3/03547; H04M 2250/22
USPC .......................................................... 345/173
See application file for complete search history.

(56) References Cited

U.S. PATENT DOCUMENTS

| | | | |
|---|---|---|---|
| 1,061,578 A | 5/1913 | Wischhusen et al. | |
| 2,063,276 A | 12/1936 | Thomas | |
| 2,903,229 A | 2/1956 | Landge | |
| 2,798,907 A | 7/1957 | Schneider | |
| 2,945,111 A | 10/1958 | McCormick | |
| 3,005,055 A | 10/1961 | Mattke | |
| 3,965,399 A | 6/1976 | Walker et al. | |
| 3,996,441 A | 12/1976 | Ohashi | |
| 4,029,915 A | 6/1977 | Ojima | |
| 4,103,252 A | 7/1978 | Bobick | |
| 4,110,749 A | 8/1978 | Janko et al. | |
| 4,115,670 A | 9/1978 | Chandler | |
| 4,121,204 A | 10/1978 | Welch et al. | |
| 4,129,747 A | 12/1978 | Pepper | |
| 4,158,216 A | 6/1979 | Bigelow | |
| 4,242,676 A | 12/1980 | Piguet et al. | |
| 4,246,452 A | 1/1981 | Chandler | |
| 4,264,903 A | 4/1981 | Bigelow | |
| 4,266,144 A * | 5/1981 | Bristol | ........................... 307/116 |
| 4,293,734 A | 10/1981 | Pepper, Jr. | |

(Continued)

FOREIGN PATENT DOCUMENTS

| CN | 1139235 A | 1/1997 |
|---|---|---|
| CN | 1455615 | 11/2003 |

(Continued)

OTHER PUBLICATIONS

SanDisk Sansa Connect User Guide; 29 pages.

(Continued)

*Primary Examiner* — Viet Pham
(74) *Attorney, Agent, or Firm* — Morrison & Foerster LLP

(57) ABSTRACT

A mutual capacitive touch sensing device is disclosed. The touch sensing device includes a mutual capacitive sensing controller having a plurality of distinct drive lines and a plurality of distinct sense lines; a source for driving a current or voltage separately though each drive line; and a mutual capacitance sensing circuit that monitors the capacitance at the sensing lines. The touch sensing device also includes a plurality of independent and spatially distinct mutual capacitive sensing nodes set up in a non two dimensional array. Each node includes a drive electrode that is spatially separated from a sense electrode. The drive electrode is coupled to one of the drive lines and the sense electrode is coupled to one of the sense lines. Each node is set up with a different combination of drive and sense line coupled thereto.

28 Claims, 9 Drawing Sheets

(56) References Cited

U.S. PATENT DOCUMENTS

| | | | |
|---|---|---|---|
| D264,969 S | 6/1982 | McGourty | |
| 4,338,502 A | 7/1982 | Hashimoto et al. | |
| 4,380,007 A | 4/1983 | Steinegger | |
| 4,380,040 A | 4/1983 | Posset | |
| 4,394,649 A | 7/1983 | Suchoff et al. | |
| 4,475,008 A | 10/1984 | Doi et al. | |
| 4,570,149 A | 2/1986 | Thornburg et al. | |
| 4,583,161 A | 4/1986 | Gunderson et al. | |
| 4,587,378 A | 5/1986 | Moore | |
| 4,604,786 A | 8/1986 | Howie, Jr. | |
| 4,613,736 A | 9/1986 | Shichijo et al. | |
| 4,644,100 A | 2/1987 | Brenner et al. | |
| 4,719,524 A | 1/1988 | Morishima et al. | |
| 4,734,034 A | 3/1988 | Maness et al. | |
| 4,736,191 A * | 4/1988 | Matzke et al. | 341/20 |
| 4,739,191 A | 4/1988 | Puar | |
| 4,739,299 A | 4/1988 | Eventoff et al. | |
| 4,752,655 A | 6/1988 | Tajiri et al. | |
| 4,755,765 A | 7/1988 | Ferland | |
| 4,764,717 A | 8/1988 | Tucker et al. | |
| 4,771,139 A | 9/1988 | DeSmet | |
| 4,798,919 A | 1/1989 | Miessler et al. | |
| 4,810,992 A | 3/1989 | Eventoff | |
| 4,822,957 A | 4/1989 | Talmage, Jr. et al. | |
| 4,831,359 A | 5/1989 | Newell | |
| 4,849,852 A | 7/1989 | Mullins | |
| 4,856,993 A | 8/1989 | Maness et al. | |
| 4,860,768 A | 8/1989 | Hon et al. | |
| 4,866,602 A | 9/1989 | Hall | |
| 4,876,524 A | 10/1989 | Jenkins | |
| 4,897,511 A | 1/1990 | Itaya et al. | |
| 4,914,624 A | 4/1990 | Dunthorn | |
| 4,917,516 A | 4/1990 | Retter | |
| 4,943,889 A | 7/1990 | Ohmatoi | |
| 4,951,036 A | 8/1990 | Grueter et al. | |
| 4,954,823 A | 9/1990 | Binstead | |
| 4,976,435 A | 12/1990 | Shatford et al. | |
| 4,990,900 A | 2/1991 | Kikuchi | |
| 5,008,497 A | 4/1991 | Asher | |
| 5,036,321 A | 7/1991 | Leach et al. | |
| 5,053,757 A | 10/1991 | Meadows | |
| 5,086,870 A | 2/1992 | Bolduc | |
| 5,125,077 A | 6/1992 | Hall | |
| 5,159,159 A | 10/1992 | Asher | |
| 5,179,648 A | 1/1993 | Hauck | |
| 5,186,646 A | 2/1993 | Pederson | |
| 5,192,082 A | 3/1993 | Inoue et al. | |
| 5,193,669 A | 3/1993 | Demeo et al. | |
| 5,231,326 A | 7/1993 | Echols | |
| 5,237,311 A | 8/1993 | Mailey et al. | |
| 5,278,362 A | 1/1994 | Ohashi | |
| 5,305,017 A * | 4/1994 | Gerpheide | 345/174 |
| 5,313,027 A | 5/1994 | Inoue et al. | |
| D349,280 S | 8/1994 | Kaneko | |
| 5,339,213 A | 8/1994 | O'Callaghan | |
| 5,367,199 A | 11/1994 | Lefkowitz et al. | |
| 5,374,787 A | 12/1994 | Miller et al. | |
| 5,379,057 A | 1/1995 | Clough et al. | |
| 5,404,152 A | 4/1995 | Nagai | |
| 5,408,621 A | 4/1995 | Ben-Arie | |
| 5,414,445 A | 5/1995 | Kaneko et al. | |
| 5,416,498 A | 5/1995 | Grant | |
| 5,424,756 A | 6/1995 | Ho et al. | |
| 5,432,531 A | 7/1995 | Calder et al. | |
| 5,438,331 A | 8/1995 | Gilligan et al. | |
| D362,431 S | 9/1995 | Kaneko et al. | |
| 5,450,075 A | 9/1995 | Waddington | |
| 5,453,761 A | 9/1995 | Tanaka | |
| 5,473,343 A | 12/1995 | Kimmich et al. | |
| 5,473,344 A | 12/1995 | Bacon et al. | |
| 5,479,192 A | 12/1995 | Carroll, Jr. et al. | |
| 5,494,157 A | 2/1996 | Golenz et al. | |
| 5,495,566 A | 2/1996 | Kwatinetz | |
| 5,508,703 A | 4/1996 | Okamura et al. | |
| 5,508,717 A | 4/1996 | Miller | |
| 5,543,588 A | 8/1996 | Bisset et al. | |
| 5,543,591 A | 8/1996 | Gillespie et al. | |
| 5,555,004 A | 9/1996 | Ono et al. | |
| 5,559,301 A | 9/1996 | Bryan, Jr. et al. | |
| 5,559,943 A | 9/1996 | Cyr et al. | |
| 5,561,445 A | 10/1996 | Miwa et al. | |
| 5,564,112 A | 10/1996 | Hayes et al. | |
| 5,565,887 A | 10/1996 | McCambridge et al. | |
| 5,578,817 A | 11/1996 | Bidiville et al. | |
| 5,581,670 A | 12/1996 | Bier et al. | |
| 5,585,823 A | 12/1996 | Duchon et al. | |
| 5,589,856 A | 12/1996 | Stein et al. | |
| 5,589,893 A | 12/1996 | Gaughan et al. | |
| 5,596,347 A | 1/1997 | Robertson et al. | |
| 5,596,697 A | 1/1997 | Foster et al. | |
| 5,598,183 A | 1/1997 | Robertson et al. | |
| 5,611,040 A | 3/1997 | Brewer et al. | |
| 5,611,060 A | 3/1997 | Belfiore et al. | |
| 5,613,137 A | 3/1997 | Bertram et al. | |
| 5,617,114 A | 4/1997 | Bier et al. | |
| 5,627,531 A | 5/1997 | Posso et al. | |
| 5,632,679 A | 5/1997 | Tremmel | |
| 5,640,258 A | 6/1997 | Kurashima et al. | |
| 5,648,642 A * | 7/1997 | Miller et al. | 178/18.06 |
| D382,550 S | 8/1997 | Kaneko et al. | |
| 5,657,012 A | 8/1997 | Tart | |
| 5,661,632 A | 8/1997 | Register | |
| D385,542 S | 10/1997 | Kaneko et al. | |
| 5,675,362 A | 10/1997 | Clough et al. | |
| 5,689,285 A | 11/1997 | Asher | |
| 5,721,849 A | 2/1998 | Amro | |
| 5,726,687 A | 3/1998 | Belfiore et al. | |
| 5,729,219 A | 3/1998 | Armstrong et al. | |
| 5,730,165 A | 3/1998 | Philipp | |
| 5,748,185 A | 5/1998 | Stephan et al. | |
| 5,751,274 A | 5/1998 | Davis | |
| 5,754,890 A | 5/1998 | Holmdahl et al. | |
| 5,764,066 A * | 6/1998 | Novak et al. | 324/662 |
| 5,777,605 A | 7/1998 | Yoshinobu et al. | |
| 5,786,818 A | 7/1998 | Brewer et al. | |
| 5,790,769 A | 8/1998 | Buxton et al. | |
| 5,798,752 A | 8/1998 | Buxton et al. | |
| 5,805,144 A | 9/1998 | Scholder et al. | |
| 5,808,602 A | 9/1998 | Sellers | |
| 5,812,239 A | 9/1998 | Eger | |
| 5,812,498 A | 9/1998 | Terés | |
| 5,815,141 A | 9/1998 | Phares | |
| 5,825,351 A * | 10/1998 | Tam | 345/173 |
| 5,825,352 A | 10/1998 | Bisset et al. | |
| 5,825,353 A | 10/1998 | Will | |
| 5,828,364 A | 10/1998 | Siddiqui | |
| 5,838,304 A | 11/1998 | Hall | |
| 5,841,078 A * | 11/1998 | Miller et al. | 178/18.06 |
| 5,841,423 A | 11/1998 | Carroll, Jr. et al. | |
| D402,281 S | 12/1998 | Ledbetter et al. | |
| 5,850,213 A | 12/1998 | Imai et al. | |
| 5,856,645 A | 1/1999 | Norton | |
| 5,856,822 A | 1/1999 | Du et al. | |
| 5,859,629 A | 1/1999 | Tognazzini | |
| 5,861,875 A * | 1/1999 | Gerpheide | 345/174 |
| 5,869,791 A | 2/1999 | Young | |
| 5,875,311 A | 2/1999 | Bertram et al. | |
| 5,883,619 A | 3/1999 | Ho et al. | |
| 5,889,236 A | 3/1999 | Gillespie et al. | |
| 5,889,511 A | 3/1999 | Ong et al. | |
| 5,894,117 A | 4/1999 | Kamishima | |
| 5,903,229 A | 5/1999 | Kishi | |
| 5,907,152 A | 5/1999 | Dandiliker et al. | |
| 5,907,318 A | 5/1999 | Medina | |
| 5,909,211 A | 6/1999 | Combs et al. | |
| 5,910,802 A | 6/1999 | Shields et al. | |
| 5,914,706 A | 6/1999 | Kono | |
| 5,923,388 A | 7/1999 | Kurashima et al. | |
| D412,940 S | 8/1999 | Kato et al. | |
| 5,933,102 A | 8/1999 | Miller et al. | |
| 5,933,141 A | 8/1999 | Smith | |
| 5,936,619 A | 8/1999 | Nagasaki et al. | |
| 5,943,044 A | 8/1999 | Martinelli et al. | |
| 5,953,000 A | 9/1999 | Weirich | |

(56) References Cited

U.S. PATENT DOCUMENTS

| | | |
|---|---|---|
| 5,956,019 A | 9/1999 | Bang et al. |
| 5,959,610 A | 9/1999 | Silfvast |
| 5,959,611 A | 9/1999 | Smailagic et al. |
| 5,964,661 A | 10/1999 | Dodge |
| 5,973,668 A | 10/1999 | Watanabe |
| 6,000,000 A | 12/1999 | Hawkins et al. |
| 6,002,093 A | 12/1999 | Hrehor et al. |
| 6,002,389 A | 12/1999 | Kasser et al. |
| 6,005,299 A | 12/1999 | Hengst |
| 6,025,832 A | 2/2000 | Sudo et al. |
| 6,031,518 A | 2/2000 | Adams et al. |
| 6,034,672 A | 3/2000 | Gaultier et al. |
| 6,057,829 A | 5/2000 | Silfvast |
| 6,075,533 A | 6/2000 | Chang |
| 6,084,574 A | 7/2000 | Bidiville |
| D430,169 S | 8/2000 | Scibora |
| 6,097,372 A | 8/2000 | Suzuki |
| 6,104,790 A | 8/2000 | Narayanaswami |
| 6,122,526 A | 9/2000 | Parulski et al. |
| 6,124,587 A | 9/2000 | Bidiville et al. |
| 6,128,006 A | 10/2000 | Rosenberg et al. |
| 6,131,048 A | 10/2000 | Sudo et al. |
| 6,141,068 A | 10/2000 | Iijima |
| 6,147,856 A * | 11/2000 | Karidis ............... 361/277 |
| 6,163,312 A | 12/2000 | Furuya |
| 6,166,721 A | 12/2000 | Kuroiwa et al. |
| 6,179,496 B1 | 1/2001 | Chou |
| 6,181,322 B1 | 1/2001 | Nanavati |
| D437,860 S | 2/2001 | Suzuki et al. |
| 6,188,391 B1 * | 2/2001 | Seely et al. ........... 345/173 |
| 6,188,393 B1 | 2/2001 | Shu |
| 6,191,774 B1 | 2/2001 | Schena et al. |
| 6,198,054 B1 | 3/2001 | Janniere |
| 6,198,473 B1 | 3/2001 | Armstrong |
| 6,211,861 B1 | 4/2001 | Rosenberg et al. |
| 6,219,038 B1 | 4/2001 | Cho |
| 6,222,528 B1 * | 4/2001 | Gerpheide et al. ........ 345/173 |
| D442,592 S | 5/2001 | Ledbetter et al. |
| 6,225,976 B1 | 5/2001 | Yates et al. |
| 6,225,980 B1 | 5/2001 | Weiss et al. |
| 6,226,534 B1 | 5/2001 | Aizawa |
| 6,227,966 B1 | 5/2001 | Yokoi |
| D443,616 S | 6/2001 | Fisher et al. |
| 6,243,078 B1 | 6/2001 | Rosenberg |
| 6,243,080 B1 | 6/2001 | Molne |
| 6,243,646 B1 | 6/2001 | Ozaki et al. |
| 6,248,017 B1 | 6/2001 | Roach |
| 6,254,477 B1 | 7/2001 | Sasaki et al. |
| 6,256,011 B1 | 7/2001 | Culver |
| 6,259,491 B1 | 7/2001 | Ekedahl et al. |
| 6,262,717 B1 | 7/2001 | Donohue et al. |
| 6,262,785 B1 | 7/2001 | Kim |
| 6,266,050 B1 | 7/2001 | Oh et al. |
| 6,285,211 B1 | 9/2001 | Sample et al. |
| D448,810 S | 10/2001 | Goto |
| 6,297,795 B1 | 10/2001 | Kato et al. |
| 6,297,811 B1 * | 10/2001 | Kent et al. ............ 345/173 |
| 6,300,946 B1 | 10/2001 | Lincke et al. |
| 6,307,539 B2 | 10/2001 | Suzuki |
| D450,713 S | 11/2001 | Masamitsu et al. |
| 6,314,483 B1 | 11/2001 | Goto et al. |
| 6,321,441 B1 | 11/2001 | Davidson et al. |
| 6,323,845 B1 | 11/2001 | Robbins |
| D452,250 S | 12/2001 | Chan |
| 6,340,800 B1 | 1/2002 | Zhai et al. |
| D454,568 S | 3/2002 | Andre et al. |
| 6,357,887 B1 | 3/2002 | Novak |
| D455,793 S | 4/2002 | Lin |
| 6,373,265 B1 | 4/2002 | Morimoto et al. |
| 6,373,470 B1 | 4/2002 | Andre et al. |
| 6,377,530 B1 | 4/2002 | Burrows |
| 6,396,523 B1 | 5/2002 | Segal et al. |
| 6,424,338 B1 | 7/2002 | Anderson |
| 6,429,846 B2 | 8/2002 | Rosenberg et al. |
| 6,429,852 B1 | 8/2002 | Adams et al. |
| 6,452,514 B1 * | 9/2002 | Philipp ............... 341/33 |
| 6,465,271 B1 * | 10/2002 | Ko et al. ............ 438/48 |
| 6,473,069 B1 | 10/2002 | Gerpheide |
| 6,492,602 B2 | 12/2002 | Asai et al. |
| 6,492,979 B1 | 12/2002 | Kent et al. |
| 6,496,181 B1 | 12/2002 | Bomer et al. |
| 6,497,412 B1 | 12/2002 | Bramm |
| D468,365 S | 1/2003 | Bransky et al. |
| D469,109 S | 1/2003 | Andre et al. |
| D472,245 S | 3/2003 | Andre et al. |
| 6,546,231 B1 | 4/2003 | Someya et al. |
| 6,587,091 B2 | 7/2003 | Serpa |
| 6,606,244 B1 | 8/2003 | Liu et al. |
| 6,618,909 B1 | 9/2003 | Yang |
| 6,636,197 B1 | 10/2003 | Goldenberg et al. |
| 6,639,584 B1 | 10/2003 | Li |
| 6,640,250 B1 | 10/2003 | Chang et al. |
| 6,650,975 B2 | 11/2003 | Ruffner |
| D483,809 S | 12/2003 | Lim |
| 6,658,773 B2 | 12/2003 | Rohne et al. |
| 6,664,951 B1 | 12/2003 | Fujii et al. |
| 6,677,927 B1 | 1/2004 | Bruck et al. |
| 6,678,891 B1 | 1/2004 | Wilcox et al. |
| 6,686,904 B1 | 2/2004 | Sherman et al. |
| 6,686,906 B2 | 2/2004 | Salminen et al. |
| 6,703,550 B2 | 3/2004 | Chu |
| 6,724,817 B1 | 4/2004 | Simpson et al. |
| 6,727,889 B2 | 4/2004 | Shaw |
| D489,731 S | 5/2004 | Huang |
| 6,738,045 B2 | 5/2004 | Hinckley et al. |
| 6,750,803 B2 | 6/2004 | Yates et al. |
| 6,781,576 B2 | 8/2004 | Tamura |
| 6,784,384 B2 | 8/2004 | Park et al. |
| 6,788,288 B2 | 9/2004 | Ano |
| 6,791,533 B2 | 9/2004 | Su |
| 6,795,057 B2 | 9/2004 | Gordon |
| D497,618 S | 10/2004 | Andre et al. |
| 6,810,271 B1 | 10/2004 | Wood et al. |
| 6,822,640 B2 | 11/2004 | Derocher |
| 6,834,975 B2 | 12/2004 | Chu-Chia et al. |
| 6,844,872 B1 | 1/2005 | Farag et al. |
| 6,855,899 B2 | 2/2005 | Sotome |
| 6,865,718 B2 | 3/2005 | Levi Montalcini |
| 6,886,842 B2 | 5/2005 | Vey et al. |
| 6,894,916 B2 | 5/2005 | Reohr et al. |
| D506,476 S | 6/2005 | Andre et al. |
| 6,922,189 B2 | 7/2005 | Fujiyoshi |
| 6,930,494 B2 | 8/2005 | Tesdahl et al. |
| 6,958,614 B2 | 10/2005 | Morimoto |
| 6,977,808 B2 | 12/2005 | Lam et al. |
| 6,978,127 B1 | 12/2005 | Bulthuis et al. |
| 6,985,137 B2 | 1/2006 | Kaikuranta |
| 7,006,077 B1 | 2/2006 | Uusimäki |
| 7,019,225 B2 | 3/2006 | Matsumoto et al. |
| 7,046,230 B2 | 5/2006 | Zadesky et al. |
| 7,050,292 B2 | 5/2006 | Shimura et al. |
| 7,069,044 B2 | 6/2006 | Okada et al. |
| 7,078,633 B2 | 7/2006 | Ihalainen |
| 7,084,856 B2 | 8/2006 | Huppi |
| 7,113,196 B2 | 9/2006 | Kerr |
| 7,113,520 B1 | 9/2006 | Meenan |
| 7,117,136 B1 | 10/2006 | Rosedale |
| 7,119,792 B1 | 10/2006 | Andre et al. |
| 7,215,319 B2 | 5/2007 | Kamijo et al. |
| 7,233,318 B1 | 6/2007 | Farag et al. |
| 7,236,154 B1 | 6/2007 | Kerr et al. |
| 7,236,159 B1 | 6/2007 | Siversson |
| 7,253,643 B1 | 8/2007 | Seguine |
| 7,279,647 B2 | 10/2007 | Philipp |
| 7,288,732 B2 | 10/2007 | Hashida |
| 7,297,883 B2 | 11/2007 | Rochon et al. |
| 7,310,089 B2 * | 12/2007 | Baker et al. ............ 345/173 |
| 7,312,785 B2 | 12/2007 | Tsuk et al. |
| 7,321,103 B2 | 1/2008 | Nakanishi et al. |
| 7,333,092 B2 | 2/2008 | Zadesky et al. |
| 7,348,898 B2 | 3/2008 | Ono |
| 7,382,139 B2 | 6/2008 | Mackey |
| 7,394,038 B2 | 7/2008 | Chang |

(56) References Cited

U.S. PATENT DOCUMENTS

| | | |
|---|---|---|
| 7,395,081 B2 * | 7/2008 | Bonnelykke Kristensen et al. .................... 455/550.1 |
| 7,397,467 B2 | 7/2008 | Park et al. |
| 7,439,963 B2 | 10/2008 | Geaghan et al. |
| 7,466,307 B2 * | 12/2008 | Trent et al. .................... 345/173 |
| 7,479,949 B2 | 1/2009 | Jobs et al. |
| 7,486,323 B2 | 2/2009 | Lee et al. |
| 7,502,016 B2 | 3/2009 | Trent, Jr. et al. |
| 7,503,193 B2 | 3/2009 | Schoene et al. |
| 7,593,782 B2 | 9/2009 | Jobs et al. |
| 7,645,955 B2 | 1/2010 | Huang et al. |
| 7,671,837 B2 | 3/2010 | Forsblad et al. |
| 7,708,051 B2 | 5/2010 | Katsumi et al. |
| 7,772,507 B2 | 8/2010 | Orr et al. |
| 2001/0011991 A1 | 8/2001 | Wang et al. |
| 2001/0011993 A1 | 8/2001 | Saarinen |
| 2001/0033270 A1 | 10/2001 | Osawa et al. |
| 2001/0043545 A1 | 11/2001 | Aratani |
| 2001/0050673 A1 | 12/2001 | Davenport |
| 2001/0051046 A1 | 12/2001 | Watanabe et al. |
| 2002/0000978 A1 | 1/2002 | Gerpheide |
| 2002/0011993 A1 | 1/2002 | Lui et al. |
| 2002/0027547 A1 | 3/2002 | Kamijo et al. |
| 2002/0030665 A1 | 3/2002 | Ano |
| 2002/0033848 A1 | 3/2002 | Sciammarella et al. |
| 2002/0039493 A1 | 4/2002 | Tanaka |
| 2002/0045960 A1 | 4/2002 | Phillips et al. |
| 2002/0071550 A1 | 6/2002 | Pletikosa |
| 2002/0089545 A1 | 7/2002 | Levi Montalcini |
| 2002/0103796 A1 | 8/2002 | Hartley |
| 2002/0104957 A1 | 8/2002 | Liess et al. |
| 2002/0118131 A1 | 8/2002 | Yates et al. |
| 2002/0118169 A1 | 8/2002 | Hinckley et al. |
| 2002/0145594 A1 | 10/2002 | Derocher |
| 2002/0154090 A1 | 10/2002 | Lin |
| 2002/0158844 A1 | 10/2002 | McLoone et al. |
| 2002/0164156 A1 | 11/2002 | Bilbrey |
| 2002/0168947 A1 | 11/2002 | Lemley |
| 2002/0180701 A1 | 12/2002 | Hayama et al. |
| 2002/0196239 A1 | 12/2002 | Lee |
| 2003/0002246 A1 | 1/2003 | Kerr |
| 2003/0025679 A1 | 2/2003 | Taylor et al. |
| 2003/0028346 A1 | 2/2003 | Sinclair et al. |
| 2003/0043121 A1 | 3/2003 | Chen |
| 2003/0043174 A1 | 3/2003 | Hinckley et al. |
| 2003/0050092 A1 | 3/2003 | Yun |
| 2003/0076301 A1 | 4/2003 | Tsuk et al. |
| 2003/0076303 A1 | 4/2003 | Huppi |
| 2003/0091377 A1 | 5/2003 | Hsu et al. |
| 2003/0095095 A1 | 5/2003 | Pihlaja |
| 2003/0095096 A1 | 5/2003 | Robbin et al. |
| 2003/0098851 A1 | 5/2003 | Brink |
| 2003/0103043 A1 * | 6/2003 | Mulligan et al. ............... 345/174 |
| 2003/0122792 A1 | 7/2003 | Yamamoto et al. |
| 2003/0135292 A1 | 7/2003 | Husgafvel et al. |
| 2003/0142081 A1 | 7/2003 | Iizuka et al. |
| 2003/0184517 A1 | 10/2003 | Senzui et al. |
| 2003/0197740 A1 | 10/2003 | Reponen |
| 2003/0206202 A1 | 11/2003 | Moriya |
| 2003/0210537 A1 | 11/2003 | Engelmann |
| 2003/0222660 A1 | 12/2003 | Morimoto |
| 2003/0224831 A1 | 12/2003 | Engstrom et al. |
| 2004/0027341 A1 | 2/2004 | Derocher |
| 2004/0074756 A1 | 4/2004 | Kawakami et al. |
| 2004/0080682 A1 | 4/2004 | Dalton |
| 2004/0109357 A1 * | 6/2004 | Cernea et al. ............ 365/185.21 |
| 2004/0150619 A1 | 8/2004 | Baudisch et al. |
| 2004/0156192 A1 | 8/2004 | Kerr et al. |
| 2004/0178997 A1 * | 9/2004 | Gillespie et al. ............... 345/173 |
| 2004/0200699 A1 | 10/2004 | Matsumoto et al. |
| 2004/0215986 A1 | 10/2004 | Shakkarwar |
| 2004/0224638 A1 | 11/2004 | Fadell et al. |
| 2004/0239622 A1 | 12/2004 | Proctor et al. |
| 2004/0252109 A1 | 12/2004 | Trent, Jr. et al. |
| 2004/0252867 A1 | 12/2004 | Lan et al. |
| 2004/0253989 A1 | 12/2004 | Tupler et al. |
| 2004/0263388 A1 | 12/2004 | Krumm et al. |
| 2004/0267874 A1 | 12/2004 | Westberg et al. |
| 2005/0012644 A1 * | 1/2005 | Hurst et al. ..................... 341/33 |
| 2005/0017957 A1 | 1/2005 | Yi |
| 2005/0024341 A1 | 2/2005 | Gillespie et al. |
| 2005/0030048 A1 | 2/2005 | Bolender |
| 2005/0052425 A1 | 3/2005 | Zadesky et al. |
| 2005/0052426 A1 | 3/2005 | Hagermoser et al. |
| 2005/0052429 A1 | 3/2005 | Philipp |
| 2005/0068304 A1 | 3/2005 | Lewis et al. |
| 2005/0083299 A1 | 4/2005 | Nagasaka |
| 2005/0083307 A1 | 4/2005 | Aufderheide |
| 2005/0090288 A1 | 4/2005 | Stohr et al. |
| 2005/0104867 A1 * | 5/2005 | Westerman et al. .......... 345/173 |
| 2005/0110768 A1 | 5/2005 | Marriott et al. |
| 2005/0129199 A1 | 6/2005 | Abe |
| 2005/0139460 A1 | 6/2005 | Hosaka |
| 2005/0140657 A1 | 6/2005 | Park et al. |
| 2005/0143124 A1 | 6/2005 | Kennedy et al. |
| 2005/0156881 A1 | 7/2005 | Trent et al. |
| 2005/0162402 A1 | 7/2005 | Watanachote |
| 2005/0204309 A1 | 9/2005 | Szeto |
| 2005/0237308 A1 | 10/2005 | Autio et al. |
| 2006/0007171 A1 | 1/2006 | Burdi et al. |
| 2006/0026521 A1 | 2/2006 | Hotelling et al. |
| 2006/0032680 A1 * | 2/2006 | Elias et al. .................. 178/18.06 |
| 2006/0038791 A1 | 2/2006 | Mackey |
| 2006/0087829 A1 | 4/2006 | Manico et al. |
| 2006/0095848 A1 | 5/2006 | Naik |
| 2006/0097991 A1 | 5/2006 | Hotelling et al. |
| 2006/0131156 A1 | 6/2006 | Voelckers |
| 2006/0143574 A1 | 6/2006 | Ito et al. |
| 2006/0174568 A1 | 8/2006 | Kinoshita et al. |
| 2006/0181517 A1 | 8/2006 | Zadesky et al. |
| 2006/0197750 A1 * | 9/2006 | Kerr et al. ..................... 345/173 |
| 2006/0232557 A1 | 10/2006 | Fallot-Burghardt |
| 2006/0236262 A1 | 10/2006 | Bathiche et al. |
| 2006/0250377 A1 | 11/2006 | Zadesky et al. |
| 2006/0274042 A1 | 12/2006 | Krah et al. |
| 2006/0274905 A1 | 12/2006 | Lindahl et al. |
| 2006/0279896 A1 | 12/2006 | Bruwer |
| 2006/0284836 A1 | 12/2006 | Philipp |
| 2007/0013671 A1 | 1/2007 | Zadesky et al. |
| 2007/0018970 A1 | 1/2007 | Tabasso et al. |
| 2007/0052044 A1 | 3/2007 | Forsblad et al. |
| 2007/0052691 A1 | 3/2007 | Zadesky et al. |
| 2007/0080936 A1 | 4/2007 | Tsuk et al. |
| 2007/0080938 A1 | 4/2007 | Robbin et al. |
| 2007/0080952 A1 | 4/2007 | Lynch et al. |
| 2007/0083822 A1 | 4/2007 | Robbin et al. |
| 2007/0085841 A1 | 4/2007 | Tsuk et al. |
| 2007/0097086 A1 | 5/2007 | Battles et al. |
| 2007/0120834 A1 | 5/2007 | Boillot |
| 2007/0126696 A1 | 6/2007 | Boillot |
| 2007/0152975 A1 | 7/2007 | Ogihara |
| 2007/0152977 A1 * | 7/2007 | Ng et al. ...................... 345/173 |
| 2007/0152983 A1 | 7/2007 | McKillop et al. |
| 2007/0155434 A1 | 7/2007 | Jobs et al. |
| 2007/0157089 A1 | 7/2007 | Van Os et al. |
| 2007/0242057 A1 | 10/2007 | Zadesky et al. |
| 2007/0247421 A1 | 10/2007 | Orsley et al. |
| 2007/0247443 A1 | 10/2007 | Philipp |
| 2007/0271516 A1 | 11/2007 | Carmichael |
| 2007/0273671 A1 | 11/2007 | Zadesky et al. |
| 2007/0276525 A1 | 11/2007 | Zadesky et al. |
| 2007/0279394 A1 | 12/2007 | Lampell |
| 2007/0285404 A1 | 12/2007 | Rimon et al. |
| 2007/0290990 A1 | 12/2007 | Robbin et al. |
| 2007/0291016 A1 | 12/2007 | Philipp |
| 2007/0296709 A1 | 12/2007 | GuangHai |
| 2008/0006454 A1 | 1/2008 | Hotelling |
| 2008/0007533 A1 | 1/2008 | Hotelling et al. |
| 2008/0007539 A1 | 1/2008 | Hotelling et al. |
| 2008/0012837 A1 | 1/2008 | Marruitt |
| 2008/0018615 A1 | 1/2008 | Zadesky et al. |
| 2008/0018616 A1 | 1/2008 | Lampell et al. |
| 2008/0018617 A1 | 1/2008 | Ng et al. |
| 2008/0036473 A1 | 2/2008 | Jansson |

(56) References Cited

U.S. PATENT DOCUMENTS

| | | |
|---|---|---|
| 2008/0036734 A1 | 2/2008 | Forsblad et al. |
| 2008/0060925 A1 | 3/2008 | Weber et al. |
| 2008/0069412 A1 | 3/2008 | Champagne et al. |
| 2008/0079699 A1 | 4/2008 | Mackey |
| 2008/0087476 A1 | 4/2008 | Prest |
| 2008/0088582 A1 | 4/2008 | Prest |
| 2008/0088596 A1 | 4/2008 | Prest |
| 2008/0088597 A1 | 4/2008 | Prest |
| 2008/0088600 A1 | 4/2008 | Prest |
| 2008/0094352 A1 | 4/2008 | Tsuk et al. |
| 2008/0098330 A1 | 4/2008 | Tsuk et al. |
| 2008/0110739 A1 | 5/2008 | Peng et al. |
| 2008/0111795 A1 | 5/2008 | Bollinger |
| 2008/0143681 A1 | 6/2008 | XiaoPing |
| 2008/0165158 A1 | 7/2008 | Hotelling et al. |
| 2008/0196945 A1 | 8/2008 | Konstas |
| 2008/0202824 A1 | 8/2008 | Philipp et al. |
| 2008/0209442 A1 | 8/2008 | Setlur et al. |
| 2008/0264767 A1 | 10/2008 | Chen et al. |
| 2008/0280651 A1 | 11/2008 | Duarte |
| 2008/0284742 A1* | 11/2008 | Prest et al. .................. 345/173 |
| 2008/0293274 A1 | 11/2008 | Milan |
| 2009/0021267 A1 | 1/2009 | Golovchenko et al. |
| 2009/0026558 A1 | 1/2009 | Bauer et al. |
| 2009/0033635 A1 | 2/2009 | Wai |
| 2009/0036176 A1 | 2/2009 | Ure |
| 2009/0058687 A1 | 3/2009 | Rothkopf et al. |
| 2009/0058801 A1 | 3/2009 | Bull |
| 2009/0058802 A1 | 3/2009 | Orsley et al. |
| 2009/0073130 A1 | 3/2009 | Weber et al. |
| 2009/0078551 A1 | 3/2009 | Kang |
| 2009/0109181 A1 | 4/2009 | Hui et al. |
| 2009/0141046 A1 | 6/2009 | Rathnam et al. |
| 2009/0160771 A1 | 6/2009 | Hinckley et al. |
| 2009/0179854 A1 | 7/2009 | Weber et al. |
| 2009/0197059 A1 | 8/2009 | Weber et al. |
| 2009/0229892 A1 | 9/2009 | Fisher et al. |
| 2009/0273573 A1 | 11/2009 | Hotelling |
| 2010/0058251 A1 | 3/2010 | Rottler et al. |
| 2010/0060568 A1 | 3/2010 | Fisher et al. |
| 2010/0073319 A1 | 3/2010 | Lyon et al. |
| 2010/0149127 A1 | 6/2010 | Fisher et al. |
| 2014/0267163 A1 | 9/2014 | Hotelling |
| 2015/0212627 A1 | 7/2015 | Hotelling |

FOREIGN PATENT DOCUMENTS

| | | |
|---|---|---|
| CN | 1499356 | 5/2004 |
| CN | 1659506 | 8/2005 |
| DE | 3615742 | 11/1987 |
| DE | 19722636 | 12/1998 |
| DE | 10022537 | 11/2000 |
| DE | 20019074 U1 | 2/2001 |
| DE | 10 2004 043 663 | 4/2006 |
| EP | 0178157 | 4/1986 |
| EP | 0419145 A1 | 3/1991 |
| EP | 0498540 | 8/1992 |
| EP | 0521683 A2 | 1/1993 |
| EP | 0674288 A1 | 9/1995 |
| EP | 0 731 407 A1 | 9/1996 |
| EP | 0 551 778 B1 | 1/1997 |
| EP | 0551778 B1 | 1/1997 |
| EP | 0880091 | 11/1998 |
| EP | 1 026 713 | 8/2000 |
| EP | 1081922 A2 | 3/2001 |
| EP | 1098241 A2 | 5/2001 |
| EP | 1 133 057 | 9/2001 |
| EP | 1162826 A2 | 12/2001 |
| EP | 1 168 396 | 1/2002 |
| EP | 1205836 A2 | 5/2002 |
| EP | 1 244 053 | 9/2002 |
| EP | 1251455 A2 | 10/2002 |
| EP | 1263193 | 12/2002 |
| EP | 1347481 | 9/2003 |
| EP | 1376326 | 1/2004 |
| EP | 1 467 392 | 10/2004 |
| EP | 1482401 A2 | 12/2004 |
| EP | 1 496 467 | 1/2005 |
| EP | 1 517 228 | 3/2005 |
| EP | 1542437 A2 | 6/2005 |
| EP | 1 589 407 | 10/2005 |
| EP | 1 784 058 A2 | 5/2007 |
| EP | 1 841 188 | 10/2007 |
| EP | 1850218 | 10/2007 |
| EP | 1 876 711 | 1/2008 |
| FR | 2 686 440 A1 | 7/1993 |
| GB | 2015167 | 9/1979 |
| GB | 2072389 | 9/1981 |
| GB | 2315186 | 1/1998 |
| GB | 2333215 | 7/1999 |
| GB | 2391060 | 1/2004 |
| GB | 2402105 A | 12/2004 |
| JP | 55-174009 | 6/1982 |
| JP | 57-95722 | 6/1982 |
| JP | 61-117619 | 6/1986 |
| JP | 61-124009 | 6/1986 |
| JP | 61-164547 | 1/1988 |
| JP | 63-106826 | 5/1988 |
| JP | 63-181022 | 7/1988 |
| JP | 63-298518 | 12/1988 |
| JP | 03-57617 | 6/1991 |
| JP | 3-192418 | 8/1991 |
| JP | 04-32920 | 2/1992 |
| JP | 4-205408 | 7/1992 |
| JP | 5-041135 | 2/1993 |
| JP | 5-080938 | 4/1993 |
| JP | 5-101741 | 4/1993 |
| JP | 05-36623 | 5/1993 |
| JP | 5-189110 | 7/1993 |
| JP | 5-205565 | 8/1993 |
| JP | 5-211021 | 8/1993 |
| JP | 5-217464 | 8/1993 |
| JP | 05-233141 | 9/1993 |
| JP | 05-262276 | 10/1993 |
| JP | 5-265656 | 10/1993 |
| JP | 5-274956 | 10/1993 |
| JP | 05-289811 | 11/1993 |
| JP | 5-298955 | 11/1993 |
| JP | 5-325723 | 12/1993 |
| JP | 06-20570 | 1/1994 |
| JP | 6-084428 | 3/1994 |
| JP | 6-089636 | 3/1994 |
| JP | 06-096639 | 4/1994 |
| JP | 6-96639 | 4/1994 |
| JP | 06-111685 | 4/1994 |
| JP | 06-111695 | 4/1994 |
| JP | 6-111695 | 4/1994 |
| JP | 6-139879 | 5/1994 |
| JP | 06-187078 | 7/1994 |
| JP | 06-208433 | 7/1994 |
| JP | 6-267382 | 9/1994 |
| JP | 06-283993 | 10/1994 |
| JP | 6-333459 | 12/1994 |
| JP | 7-107574 | 4/1995 |
| JP | 07-107574 | 4/1995 |
| JP | 7-41882 | 7/1995 |
| JP | 07-41882 | 7/1995 |
| JP | 7-201249 | 8/1995 |
| JP | 07-201256 | 8/1995 |
| JP | 07-253838 | 10/1995 |
| JP | 07-261899 | 10/1995 |
| JP | 7-261899 | 10/1995 |
| JP | 7-261922 | 10/1995 |
| JP | 07-296670 | 11/1995 |
| JP | 7-319001 | 12/1995 |
| JP | 08-016292 | 1/1996 |
| JP | 8-115158 | 5/1996 |
| JP | 08-115158 | 5/1996 |
| JP | 8-203387 | 8/1996 |
| JP | 8-293226 | 11/1996 |
| JP | 8-298045 | 11/1996 |
| JP | 08-299541 | 11/1996 |
| JP | 8-316664 | 11/1996 |

(56) References Cited

FOREIGN PATENT DOCUMENTS

| | | |
|---|---|---|
| JP | 09-044289 | 2/1997 |
| JP | 09-069023 | 3/1997 |
| JP | 09-128148 | 5/1997 |
| JP | 9-134248 | 5/1997 |
| JP | 9-218747 | 8/1997 |
| JP | 9-230993 | 9/1997 |
| JP | 09-230993 | 9/1997 |
| JP | 9-231858 | 9/1997 |
| JP | 09-233161 | 9/1997 |
| JP | 9-251347 | 9/1997 |
| JP | 9-258895 | 10/1997 |
| JP | 9-288926 | 11/1997 |
| JP | 9-512979 | 12/1997 |
| JP | 10-63467 | 3/1998 |
| JP | 10-74127 | 3/1998 |
| JP | 10-074429 | 3/1998 |
| JP | 10-198507 | 7/1998 |
| JP | 10-227878 | 8/1998 |
| JP | 10-240693 | 9/1998 |
| JP | 10-320322 | 12/1998 |
| JP | 10-326149 | 12/1998 |
| JP | 11-24834 | 1/1999 |
| JP | 11-184607 | 7/1999 |
| JP | 11-194863 | 7/1999 |
| JP | 11-194872 | 7/1999 |
| JP | 11-194882 | 7/1999 |
| JP | 11-194883 | 7/1999 |
| JP | 11-194891 | 7/1999 |
| JP | 11-195353 | 7/1999 |
| JP | 11-203045 | 7/1999 |
| JP | A 100-12010 | 7/1999 |
| JP | A 100-12025 | 7/1999 |
| JP | A 100-12026 | 7/1999 |
| JP | A 100-12027 | 7/1999 |
| JP | A 100-12028 | 7/1999 |
| JP | A 100-12029 | 7/1999 |
| JP | 11-212725 | 8/1999 |
| JP | 11-272378 | 10/1999 |
| JP | A 100-89535 | 10/1999 |
| JP | 11-338628 | 12/1999 |
| JP | 2000-200147 | 7/2000 |
| JP | 2000-215549 | 8/2000 |
| JP | 2000-267786 | 9/2000 |
| JP | 2000-267797 | 9/2000 |
| JP | 2000-353045 | 12/2000 |
| JP | 2001-11769 | 1/2001 |
| JP | 2001-22508 | 1/2001 |
| JP | 2001-184158 | 7/2001 |
| JP | 3085481 | 2/2002 |
| JP | 2002-215311 | 8/2002 |
| JP | 2003-015796 | 1/2003 |
| JP | 2003-060754 | 2/2003 |
| JP | 2003-099198 | 4/2003 |
| JP | 2003-150303 | 5/2003 |
| JP | 2003-517674 | 5/2003 |
| JP | 2003-280799 | 10/2003 |
| JP | 2003-280807 | 10/2003 |
| JP | 2004-362097 | 12/2004 |
| JP | A 2005-99635 | 9/2005 |
| JP | A 2005-133824 | 10/2005 |
| JP | A 2005-134953 | 10/2005 |
| JP | A 2005-235579 | 1/2006 |
| JP | A 2005-358970 | 7/2006 |
| JP | 3852854 | 9/2006 |
| JP | 3852854 | 12/2006 |
| JP | A 2005-312433 | 5/2007 |
| KR | 1998-71394 | 10/1998 |
| KR | 1999-50198 | 7/1999 |
| KR | 2000-08579 | 2/2000 |
| KR | 2001-0052016 | 6/2001 |
| KR | 2001-108361 | 12/2001 |
| KR | 2002-65059 | 8/2002 |
| KR | 10-2006-0021678 | 3/2006 |
| TW | 431607 | 4/2001 |
| TW | 00470193 | 12/2001 |
| TW | 547716 | 8/2003 |
| TW | I220491 | 8/2004 |
| WO | WO-94/17494 | 8/1994 |
| WO | WO 95/00897 A1 | 1/1995 |
| WO | WO-96/27968 | 9/1996 |
| WO | WO-98/14863 | 4/1998 |
| WO | WO-99/49443 | 9/1999 |
| WO | WO-00/79772 | 12/2000 |
| WO | WO-01/02949 | 1/2001 |
| WO | WO-01/44912 | 6/2001 |
| WO | WO-02/08881 | 1/2002 |
| WO | WO-03/044645 A1 | 5/2003 |
| WO | WO 03/044956 | 5/2003 |
| WO | WO-03/025960 | 9/2003 |
| WO | WO 03/088176 | 10/2003 |
| WO | WO 03/090008 | 10/2003 |
| WO | WO-2004/001573 | 12/2003 |
| WO | WO 2004/040606 | 5/2004 |
| WO | WO-2004/091956 | 10/2004 |
| WO | WO-2005/055620 A2 | 6/2005 |
| WO | WO 2005/076117 | 8/2005 |
| WO | WO-2005/114369 | 12/2005 |
| WO | WO-2005/124526 A2 | 12/2005 |
| WO | WO-2006/020305 | 2/2006 |
| WO | WO-2006/021211 A2 | 3/2006 |
| WO | WO 2006/037545 | 4/2006 |
| WO | WO 2006/104745 | 10/2006 |
| WO | WO-2006/135127 | 12/2006 |
| WO | WO 2007/025858 | 3/2007 |
| WO | WO-2007/078477 | 7/2007 |
| WO | WO-2007/084467 | 7/2007 |
| WO | WO-2007/089766 | 8/2007 |
| WO | WO-2008/007372 | 1/2008 |
| WO | WO-2008/045414 | 4/2008 |
| WO | WO-2008/045833 | 4/2008 |

OTHER PUBLICATIONS

Robbin, U.S. Appl. No. 60/346,237 entitled, "Method and System for List Scrolling," filed Oct. 22, 2001; 12 pages.

Zadesky et al., U.S. Appl. No. 60/359,551 entitled "Touchpad for Handheld Device," filed Feb. 25, 2002; 34 pages.

Grignon et al., U.S. Appl. No. 60/755,656, filed Dec. 30, 2005, entitled "Touch Pad with Feedback"; 109 pages.

Elias et al., U.S. Appl. No. 60/522,107, filed Aug. 16, 2004, entitled, "A Method for Increasing the Spatial Resolution of Touch Sensitive Devices"; 15 pages.

Hotelling, U.S. Appl. No. 60/658,777 titled "Multi-Functional Handheld Device," filed Mar. 4, 2005; 68 pages.

Zadesky et al., U.S. Appl. No. 60/714,609 entitled "Scrolling Input Arrangements Using Capacitive Sensors on a Flexible Membrane," filed Sep. 6, 2005; 17 pages.

Lampell et al., U.S. Appl. No. 60/810,423, filed Jun. 2, 2006, entitled "Techniques for Interactive Input to Portable Electronic Devices"; 53 pages.

Prest et al., U.S. Appl. No. 60/850,662, filed Oct. 11, 2006, entitled, "Capacitive Scroll Wheel"; 21 pages.

Bollinger, U.S. Appl. No. 60/858,404, filed Nov. 13, 2006, entitled "Method of Capacitively Sensing Finger Position"; 13 pages.

Rothkopf, U.S. Appl. No. 60/935,854 titled "Compact Media Players," filed Sep. 4, 2007; 36 pages.

Rathnam et al., U.S. Appl. No. 60/992,056, filed Dec. 3, 2007, entitled, "Scroll Wheel Circuit Arrangements and Methods of Use Thereof"; 42 pages.

Rathnam et al., U.S. Appl. No. 61/017,436, filed Dec. 28, 2007, entitled, "Multi-Touch Scroll Wheel Circuit Arrangements and Processing Methods"; 58 pages.

Weber et al., U.S. Appl. No. 61/020,531, filed Jan. 11, 2008 entitled "Modifiable Clickwheel Text"; 11 pages.

Weber et al., U.S. Appl. No. 61/025,531, filed Feb. 1, 2008 entitled "Co-Extruded Materials and Methods"; 11 pages.

Fisher et al., U.S. Appl. No. 61/036,804, filed Mar. 14, 2008 entitled "Switchable Sensor Configurations"; 46 pages.

"Touchpad," Notebook PC Manual, ACER Information Co. Ltd., Feb. 16, 2005, pp. 11-12.

(56) References Cited

OTHER PUBLICATIONS

"Atari VCS/2600 Peripherals" www.classicgaming.com, downloaded Feb. 28, 2007, pp. 1-15.
"Alps Electric introduces the GlidePoint Wave Keyboard; combines a gently curved design with Alps' advanced GlidePoint Technology", Business Wire, (Oct. 21, 1996).
Alps Electric Ships GlidePoint Keyboard for the Macintosh; Includes a GlidePoint Touchpad, Erase-Eaze Backspace Key and Contoured Wrist Rest, Business Wire, (Jul. 1, 1996).
"APS show guide to exhibitors", Physics Today, 49(3) (Mar. 1996).
"Design News literature plus", Design News, 51(24) (Dec. 18, 1995).
"Manufactures", Laser Focus World, Buyers Guide '96, 31(12) (Dec. 1995).
"National Design Engineering Show", Design News, 52(5) (Mar. 4, 1996).
"Preview of exhibitor booths at the Philadelphia show", Air Conditioning Heating & Refrigerator News, 200(2) (Jan. 13, 1997).
"Product news", Design News, 53(11) (Jun. 9, 1997).
"Product news", Design News, 53(9) (May 5, 1997).
Ahl, David, "Controller Updated", Creative Computing 9(12) (Dec. 1983).
Baig, E.C., "Your PC Might Just Need a Mouse," U.S. News and World Report, 108(22) (Jun. 4, 1990).
Bartimo, Jim, "The Portables: Traveling Quickly", Computerworld (Nov. 14, 1983).
Brink et al., "Pumped-up portables", U.S. News & World Report, 116(21) (May 30, 1994).
Brown et al., "Windows on Tablets as a Means of Achieving Virtual Input Devices", Human-Computer Interaction—Interact '90 (1990).
Buxton et al., "Issues and Techniques in Touch-Sensitive Tablet Input", Computer Graphics, 19(3), Proceedings of SIGGRAPH '85 (1985).
Chen et al., "A Study in Interactive 3-D Rotation Using 2-D Control Devices", Computer Graphics 22(4) (Aug. 1988).
Evans et al., "Tablet-based Valuators that Provide One, Two, or Three Degrees of Freedom", Computer Graphics 15(3) (Aug. 1981).
Jesitus, John , "Broken promises?", Industry Week/IW, 246(20) (Nov. 3, 1997).
Mims, Forrest M. III, "A Few Quick Pointers; Mouses, Touch Screens, Touch Pads, Light Pads, and the Like Can Make Your System Easier to Use," Computers and Electronics, 22 (May 1984).
Nass, Richard, "Touchpad input device goes digital to give portable systems a desktop "mouse-like" feel", Electronic Design, 44(18) (Sep. 3, 1996).
Perenson, Melissa, "New & Improved: Touchpad Redux", PC Magazine (Sep. 10, 1996).
Petersen, marty, "KoalapadTouch tablet & Micro Illustrator Software," InfoWorld, (Oct. 10, 1983).
Petruzzellis, "Force-Sensing Resistors" Electronics Now, 64(3), (Mar. 1993).
Soderholm, Lars D., "Sensing Systems for 'Touch and Feel,'" Design News (May 8, 1989).
Sony presents "Choice Without Compromise" at IBC '97 M2 Presswire (Jul. 24, 1997).
Spiwak, Marc, "A Great New Wireless Keyboard", Popular Electronics, 14(12) (Dec. 1997).
Spiwak, Marc, "A Pair of Unusual Controllers", Popular Electronics 14(4) (Apr. 1997).
Tessler, Franklin, "Point Pad", Macworld 12(10) (Oct. 1995).
Tessler, Franklin, "Smart Input: How to Chose from the New Generation of Innovative Input Devices," Macworld 13(5) (May 1996).
Tessler, Franklin, "Touchpads", Macworld 13(2) (Feb. 1996).
"Triax Custom Controllers Due; Video Game Controllers," HFD—The Weekly Home Furnishings Newspaper 67(1) (Jan. 4, 1993).
Translation of Trekstor's Defense Statement to the District Court Mannheim of May 23, 2008; 37 pages.
"Diamond Multimedia Announces Rio PMP300 Portable MP3 Music Player," located at http://news.harmony-central.com/Newp/1998/Rio-PMP300.html visited on May 5, 2008. (4 pages).
Chinese Office Action issue Dec. 29, 2006, directed to CN Application No. 200510103886.3, 25 pages.
"About Quicktip®" www.logicad3d.com/docs/qt.html downloaded Apr. 8, 2002.
"Apple Presents iPod: Ultra-Portable MP3 Music Player Puts 1,000 Songs in Your Pocket," retreived from http://www.apple.com/pr/library/2001/oct/23ipod.html on Oct. 23, 2001.
"Apple Unveils Optical Mouse and New Pro Keyboard," Press Release, Jul. 19, 2000.
"Der Klangmeister," Connect Magazine, Aug. 1998.
"Neuros MP3 Digital Audio Computer," www.neurosaudio.com, downloaded Apr. 9, 2003.
"OEM Touchpad Modules" website www.glidepoint.com/sales/modules.index.shtml, downloaded Feb. 13, 2002.
"Product Overview—ErgoCommander®, " www.logicad3d.com/products/ErgoCommander.htm, downloaded Apr. 8, 2002.
"Product Overview—SpaceMouse® Classic," www.logicad3d.com/products/Classic.htm, downloaded Apr. 8, 2002.
"System Service and Troubleshooting Manual," www.dsplib.com/intv/Master, downloaded Dec. 11, 2002.
"Synaptics Tough Pad Interfacing Guide," Second Edition, Mar. 25, 1998, Synaptics, Inc., San Jose, CA, pp. 1-90.
Bang & Olufsen Telecom a/s, "BeoCom 6000 User Guide 2000."
BeoCom 6000, Sales Training Brochure, date unknown.
BeoCom 6000, Sales Training Brochure, date unknown.
Bray, "Phosphors help switch on xenon," Physics in Action, pp. 1-3, Apr. 1999.
Chapweske, Adam "PS/2 Mouse/Keyboard Protocol," 1999, http://panda.cs.ndsu.nodak.edu/~achapwes/PICmicro/PS2/ps2.htm.
De Meyer, Kevin, "Crystal Optical Mouse," Feb. 14, 2002, Heatseekerz, Web Article 19.
EVB Elektronik "TSOP6238 IR Receiver Modules for Infrared Remote Control Systems" dated Jan. 2004 1 page.
Fiore, "Zen Touchpad," Cornell University, May 2000, 6 pages.
Gadgetboy, "Point and click with the latest mice," CNET Asia Product Review, www.asia.cnet.com/reviews...are/gadgetboy/0,39001770,380235900,00.htm, downloaded Dec. 5, 2001.
Gfroerer, "Photoluminescence in Analysis of Surfaces and Interfaces," Encyclopedia of Analytical Chemistry, pp. 1-23, Copyright John Wiley & Sons Ltd, Chichester, 2000.
Letter re: Bang & Olufsen a/s by David Safran, Nixon Peabody, LLP May 21, 2004.
Luna Technologies International, Inc., LUNA Photoluminescent Safety Products, "Photoluminescence—What is Photoluminescence?" from website at http://www.lunaplast.com/photoluminescence.com on Dec. 27, 2005.
Photographs of Innovation 2000 Best of Show Award Presented at the 2000 Int'l CES Innovations 2000 Design & Engineering Showcase, 1 page.
Ahmad, "A Usable Real-Time 3D Hand Tracker," Proceedings of the 28th Asilomar Conference on Signals, Systems and Computers—Part 2 (of 2) vol. 2 (Oct. 1994), 5 pages.
Sylvania, "Intellvision™ Intelligent Television Master Component Service Manual," pp. 1, 2 and 8, 1979.
Robbin et al., U.S. Appl. No. 60/387,692 entitled "Method and Apparatus for Use of Rotational User Inputs," filed Jun. 10, 2002.
Robbin et al., U.S. Appl. No. 60/399,806 entitled "Graphical User Interface and Methods of Use Thereof in a Multimedia Player," filed Jul. 30, 2002.
Tsuk et al., U.S. Office Action mailed Oct. 13, 2006, directed to U.S. Appl. No. 10/256,716; 16 pages.
Tsuk et al., U.S. Office Action mailed Aug. 3, 2006, directed to U.S. Appl. No. 10/256,716; 15 pages.
Tsuk et al., U.S. Office Action mailed Jan. 10, 2006, directed to U.S. Appl. No. 10/256,716; 12 pages.
Tsuk et al., U.S. Office Action mailed Jun. 24, 2005, directed to U.S. Appl. No. 10/256,716; 12 pages.
Tsuk et al., U.S. Office Action mailed Sep. 30, 2004, directed to U.S. Appl. No. 10/256,716; 11 pages.
Tsuk et al., U.S. Office Action mailed Jul. 7, 2009, directed to U.S. Appl. No. 11/610,190; 24 pages.
Robbin et al., U.S. Office Action mailed Jan. 18, 2007, directed to U.S. Appl. No. 10/259,159; 18 pages.

(56) References Cited

OTHER PUBLICATIONS

Robbin et al., U.S. Office Action mailed Oct. 13, 2006, directed to U.S. Appl. No. 10/259,159; 18 pages.
Robbin et al., U.S. Office Action mailed Aug. 3, 2006, directed to U.S. Appl. No. 10/259,159; 15 pages.
Robbin et al., U.S. Office Action mailed Jan. 11, 2006, directed to U.S. Appl. No. 10/259,159; 15 pages.
Robbin et al., U.S. Office Action mailed Jun. 16, 2005, directed to U.S. Appl. No. 10/259,159; 16 pages.
Robbin et al., U.S. Office Action mailed Sep. 30, 2004, directed to U.S. Appl. No. 10/259,159; 14 pages.
Zadesky et al., U.S. Office Action mailed Jul. 9, 2008, directed to U.S. Appl. No. 10/643,256; 12 pages.
Zadesky et al., U.S. Office Action mailed Dec. 12, 2007, directed to U.S. Appl. No. 10/643,256; 12 pages.
Zadesky et al., U.S. Office Action mailed Jul. 13, 2007, directed to U.S. Appl. No. 10/643,256; 13 pages.
Zadesky et al., U.S. Office Action mailed Mar. 23, 2007, directed to U.S. Appl. No. 10/643,256; 11 pages.
Zadesky et al., U.S. Office Action mailed Oct. 27, 2006, directed to U.S. Appl. No. 10/643,256; 14 pages.
Forsblad et al., U.S. Office Action mailed Jun. 25, 2009, directed to U.S. Appl. No. 11/355,022; 18 pages.
Forsblad et al., U.S. Office Action mailed Jan. 26, 2009, directed to U.S. Appl. No. 11/355,022; 15 pages.
Hotelling et al., U.S. Office Action mailed Jan. 27, 2009, directed to U.S. Appl. No. 11/882,421; 15 pages.
Zadesky et al., U.S. Office Action mailed Aug. 6, 2009, directed to U.S. Appl. No. 11/057,050; 30 pages.
Zadesky et al., U.S. Office Action mailed Feb. 20, 2009, directed to U.S. Appl. No. 11/057,050; 25 pages.
Zadesky et al., U.S. Office Action mailed Dec. 24, 2008, directed to U.S. Appl. No. 11/057,050; 25 pages.
Zadesky et al., U.S. Office Action mailed Nov. 26, 2008, directed to U.S. Appl. No. 11/057,050; 25 pages.
Zadesky et al, U.S. Office Action mailed Aug. 19, 2008, directed to U.S. Appl. No. 11/057,050; 23 pages.
Zadesky et al., U.S. Office Action mailed Nov. 20, 2007, directed to U.S. Appl. No. 11/057,050; 33 pages.
Zadesky et al., U.S. Office Action mailed Mar. 5, 2009, directed to U.S. Appl. No. 11/477,469; 12 pages.
Zadesky et al., U.S. Office Action mailed Jul. 30, 2004, directed to U.S. Appl. No. 10/188,182; 7 pages.
Zadesky et al., U.S. Office Action mailed Sep. 21, 2005, directed to U.S. Appl. No. 10/188,182; 10 pages.
Zadesky et al., U.S. Office Action mailed Mar. 4, 2004, directed to U.S. Appl. No. 10/188,182; 8 pages.
Zadesky et al., U.S. Office Action mailed Oct. 4, 2007, directed to U.S. Appl. No. 11/386,238; 12 pages.
Zadesky et al.., U.S. Office Action mailed Oct. 4, 2007, directed to U.S. Appl. No. 11/806,957; 14 pages.
Marriott et al., U.S. Office Action mailed Jan. 30, 2008, directed to U.S. Appl. No. 10/722,948; 17 pages.
Marriott et al., U.S. Office Action mailed Jul. 13, 2007, directed to U.S. Appl. No. 10/722,948; 15 pages.
Marriott et al., U.S. Office Action mailed Dec. 12, 2006, directed to U.S. Appl. No. 10/722,948; 14 pages.
Marriott et al., U.S. Office Action mailed Jun. 2, 2006, directed to U.S. Appl. No. 10/722,948; 12 pages.
Hotelling et al., U.S. Office Action mailed Jul. 24, 2009, directed to U.S. Appl. No. 11/483,008; 17 pages.
Hotelling et al., U.S. Office Action mailed Jul. 27, 2009, directed to U.S. Appl. No. 11/882,420; 17 pages.
Elias et al., U.S. Office Action mailed Aug. 4, 2009, directed to U.S. Appl. No. 11/203,692; 12 pages.
Elias et al., U.S. Office Action mailed Feb. 23, 2009, directed to U.S. Appl. No. 11/203,692; 13 pages.
Elias et al., U.S. Office Action mailed Sep. 17, 2008, directed to U.S. Appl. No. 11/203,692; 8 pages.

Kobayashi (1996) "Design of Dynamic Soundscape: Mapping Time to Space for Audio Browsing with Simultaneous Listening," Thesis submitted to Program in Media Arts and Sciences at the Massachusetts Institute of Technology, (58 pages).
Kobayashi et al. (1997) "Dynamic Soundscape: Mapping Time to Space for Audio Browsing," *Computer Human Interaction*: 16 pages.
Kobayashi et al. "Development of the Touch Switches with the Click Response," Koukuu Denshi Gihou No. 17: pp. 44-48 (1994-3) (published by the Japan Aviation Electronics Industry, Ltd.); Translation of Summary.
International Search Report and Written Opinion, dated Dec. 6, 2007, directed to related International Application No. PCT/US2007/015501.
Tsuk et al., U.S. Office Action mailed Aug. 7, 2009, directed to U.S. Appl. No. 11/610,181; 20 pages.
Robbin et al., U.S. Office Action mailed Aug. 10, 2009, directed to U.S. Appl. No. 11/610,376; 11 pages.
Robbin et al., U.S. Office Action mailed Aug. 12, 2009, directed to U.S. Appl. No. 11/610,384; 20 pages.
Lampell, U.S. Office Action mailed Sep. 15, 2009, directed to U.S. Appl. No. 11/530,807; 15 pages.
Boling, Douglas (1993) "Programming Microsoft Windows CE.NET," p. 109.
Interlink Electronics, VersaPad: Integration Guide, ©1998 (VersaPad), pp. 1-35.
Ng et al., U.S. Office Action mailed Jan. 14, 2010, directed to U.S. Appl. No. 11/394,493; 20 pages.
Ng et al., U.S. Office Action mailed Jan. 15, 2010, directed to U.S. Appl. No. 11/882,423; 22 pages.
Tsuk et al., U.S. Office Action mailed Dec. 31, 2009, directed to U.S. Appl. No. 11/610,190; 25 pages.
Zadesky et al., U.S. Office Action mailed Feb. 4, 2010, directed to U.S. Appl. No. 11/477,469; 14 pages.
Lynch et al., U.S. Office Action mailed Oct. 5, 2009, directed to U.S. Appl. No. 11/499,360; 7 pages.
Lynch et al., U.S. Office Action mailed Jan. 27, 2010, directed to U.S. Appl. No. 11/499,360; 8 pages.
Letter re: Bang & Olufsen a/s by David-Safran, Nixon Peabody, LLP, May 21, 2004, with BeoCom 6000 Sales Training Brochure, 7 pages.
Kobayashi et al. (1994) "Development of the Touch Switches with the Click Response," Koukuu Denshi Gihou No. 17, pp. 44-48 (published by the Japan Aviation Electronics Industry, Ltd.).
Photographs of Innovation 2000 Best of Show Award Presented at the 2000 Int'l CES Innovations Design & Engineering Showcase, Jan. 6, 2000, 1 page.
SanDisk Sansa Connect User Guide, 2007; 29 pages.
Tsuk et al., U.S. Office Action mailed Apr. 28, 2010, directed to U.S. Appl. No. 11/610,190; 29 pages.
Zadesky et al., U.S. Office Action mailed Mar. 30, 2010, directed to U.S. Appl. No. 11/592,679; 13 pages.
Hotelling et al., U.S. Office Action mailed Mar. 30, 2010, directed to U.S. Appl. No. 11/483,008; 20 pages.
Elias et al., U.S. Office Action mailed Mar. 30, 2010, directed to U.S. Appl. No. 11/203,692; 15 pages.
Ng et al., U.S. Office Action mailed Jul. 8, 2010, directed to U.S. Appl. No. 11/882,423; 19 pages.
Tsuk et al., U.S. Office Action mailed Aug. 6, 2010, directed to U.S. Appl. No. 11/610,190; 30 pages.
Zadesky et al., U.S. Office Action mailed Aug. 2, 2010, directed to U.S. Appl. No. 11/882,004; 9 pages.
Marriott et al., U.S. Office Action mailed Aug. 19, 2010, directed to U.S. Appl. No. 11/882,422; 13 pages.
Hotelling, U.S. Office Action mailed Aug. 18, 2010, directed to U.S. Appl. No. 11/882,424; 16 pages.
Bull, U.S. Office Action mailed Jul. 9, 2010, directed to U.S. Appl. No. 11/849,801; 13 pages.
Ng et al., U.S. Office Action mailed Jun. 22, 2010, directed to U.S. Appl. No. 11/394,493; 14 pages.
Lampell, U.S. Office Action mailed Jun. 4, 2010, directed to U.S. Appl. No. 11/530,807; 15 pages.
Prest et al., U.S. Office Action mailed Jun. 22, 2010, directed to U.S. Appl. No. 11/878,132; 32 pages.

(56) References Cited

OTHER PUBLICATIONS

Prest et al., U.S. Office Action mailed Jun. 22, 2010, directed to U.S. Appl. No. 11/882,882; 32 pages.
Prest et al., U.S. Office Action mailed Jun. 23, 2010, directed to U.S. Appl. No. 11/812,384; 29 pages.
Prest et al., U.S. Office Action mailed Jun. 22, 2010, directed to U.S. Appl. No. 11/882,890; 15 pages.
Prest et al., U.S. Office Action mailed Jun. 22, 2010, directed to U.S. Appl. No. 11/812,383; 21 pages.
Prest et al., U.S. Office Action mailed Jun. 23, 2010, directed to U.S. Appl. No. 11/882,889; 13 pages.
Bollinger et al., U.S. Office Action mailed Jun. 25, 2010, directed to U.S. Appl. No. 11/842,724; 22 pages.
Elias et al., U.S. Office Action mailed Jun. 11, 2010, directed to U.S. Appl. No. 11/203,692; 17 pages.
Weber et al., U.S. Office Action mailed Jun. 7, 2010, directed to U.S. Appl. No. 11/856,530; 15 pages.
Tsuk et al., U.S. Office Action mailed Nov. 1, 2010, directed U.S. Appl. No. 11/959,918; 8 pages.
Tsuk et al., U.S. Office Action mailed Oct. 26, 2010, directed to U.S. Appl. No. 11/959,942; 27 pages.
Robbin et al., U.S. Office Action mailed Oct. 29, 2010, directed to U.S. Appl. No. 11/838,845; 8 pages.
Ng et al., U.S. Office Action mailed Oct. 26, 2010, directed to U.S. Appl. No. 11/882,423; 18 pages.
Zadesky et al., U.S. Office Action mailed Oct. 4, 2010, directed to U.S. Appl. No. 11/057,050; 31 pages.
McKillop et al., U.S. Office Action mailed Sep. 16, 2010, directed to U.S. Appl. No. 11/591,752; 14 pages.
Zadesky et al., U.S. Office Action mailed Sep. 29, 2010, directed to U.S. Appl. No. 11/882,003; 13 pages.
Hotelling et al., U.S. Office Action mailed Oct. 27, 2010, directed to U.S. Appl. No. 11/483,008; 23 pages.
Weber et al., U.S. Office Action mailed Oct. 13, 2010, directed to U.S. Appl. No. 12/205,795; 15 pages.
Hotelling, U.S. Office Action mailed Apr. 29, 2011, directed to U.S. Appl. No. 11/882,424; 10 pages.
Zadesky et al, U.S. Office Action mailed Feb. 1, 2011, directed to U.S. Appl. No. 11/882,004; 16 pages.
Bull, U.S. Office Action mailed Feb. 4, 2011, directed to U.S. Appl. No. 11/849,801; 22 pages.
Weber et al, U.S. Office Action mailed Jan. 7, 2011, directed to U.S. Appl. No. 11/856,530; 13 pages.
Weber et al., U.S. Office Action mailed Jan. 7, 2011, directed to U.S. Appl. No. 12/205,795; 21 pages.
Weber et al., U.S. Office Action mailed Feb. 17, 2011, directed to U.S. Appl. No. 12/844,502; 11 pages.
Ng et al., U.S. Office Action mailed Dec. 9, 2010, directed to U.S. Appl. No. 11/394,493; 13 pages.
Zadesky et al., U.S. Office Action mailed Nov. 16, 2010, directed to U.S. Appl. No. 11/477,469; 13 pages.
Lampell, U.S. Office Action mailed Dec. 3, 2010, directed to U.S. Appl. No. 11/530,807; 17 pages.
Lampell et al., U.S. Office Action mailed Dec. 22, 2010, directed to U.S. Appl. No. 11/882,427; 16 pages.
Elias et al., U.S. Office Action mailed Nov. 22, 2010, directed to U.S. Appl. No. 11/203,692; 6 pages.
Tsuk et al., U.S. Office Action mailed Apr. 19, 2011, directed to U.S. Appl. No. 11/610,190; 25 pages.
Tsuk et al., U.S. Office Action mailed Mar. 31, 2011, directed to U.S. Appl. No. 11/959,918; 9 pages.
Robbin et al., U.S. Office Action mailed Apr. 26, 2011, directed to U.S. Appl. No. 11/838,845; 9 pages.
Zadesky et al., U.S. Office Action mailed Mar. 31, 2011, directed to U.S. Appl. No. 11/882,005; 7 pages.
Bollinger et al., U.S. Office Action mailed Mar. 21, 2011, directed to U.S. Appl. No. 11/842,724; 22 pages.
McKillop et al., U.S. Office Action mailed Mar. 24, 2011, directed to U.S. Appl. No. 11/591,752; 11 pages.
Zadesky et al., U.S. Office Action mailed Mar. 16, 2011, directed to U.S. Appl. No. 11/882,003; 12 pages.
Rathnam et al., U.S. Office Action mailed Mar. 24, 2011, directed to U.S. Appl. No. 12/205,757; 14 pages.
Hotelling, U.S. Office Action mailed Jun. 10, 2015, directed to U.S. Appl. No. 14/678,597; 11 pages.
Hotelling, U.S. Office Action mailed Dec. 15, 2011, directed to U.S. Appl. No. 11/882,424; 16 pages.
Hotelling, U.S. Office Action mailed Jun. 21, 2012, directed to U.S. Appl. No. 11/882,424; 15 pages.
Hotelling, U.S. Office Action mailed Sep. 28, 2012, directed to U.S. Appl. No. 11/882,424; 11 pages.
Hotelling, U.S. Office Action mailed Jul. 2, 2014, directed to U.S. Appl. No. 14/293,843; 5 pages.
Hotelling, U.S. Office Action mailed Mar. 13, 2015, directed to U.S. Appl. No. 14/293,843; 11 pages.
Hotelling, U.S. Office Action mailed Oct. 11, 2012, directed to U.S. Appl. No. 12/498,119; 18 pages.
Hotelling, U.S. Office Action mailed Nov. 29, 2012, directed to U.S. Appl. No. 12/498,119; 19 pages.
Hotelling, U.S. Office Action mailed Sep. 23, 2013, directed to U.S. Appl. No. 12/498,119; 19 pages.
Hotelling, U.S. Office Action mailed Sep. 14, 2015, directed to U.S. Appl. No. 14/678,597; 11 pages.

* cited by examiner

MUTUAL CAPACITANCE TOUCH SENSING DEVICE

CROSS REFERENCE TO RELATED APPLICATIONS

This application is related to the following applications, all of which are herein incorporated by reference: U.S. patent application Ser. No. 10/188,182, titled "TOUCH PAD FOR HANDHELD DEVICE", filed Jul. 1, 2002; U.S. patent application Ser. No. 10/722,948, titled "TOUCH PAD FOR HANDHELD DEVICE", filed Nov. 25, 2003; U.S. patent application Ser. No. 10/643,256, titled "MOVABLE TOUCH PAD WITH ADDED FUNCTIONALITY", filed Aug. 18, 2003; U.S. patent application Ser. No. 10/840,862, titled "MULTIPOINT TOUCHSCREEN", filed May 6, 2004; U.S. patent application Ser. No. 11/057,050, titled "DISPLAY ACTUATOR", filed Feb. 11, 2005; and U.S. patent application Ser. No. 11/115,539, titled "HAND HELD ELECTRONIC DEVICE WITH MULTIPLE TOUCH SENSING DEVICES".

BACKGROUND OF THE INVENTION

1. Field of the Invention

The present invention relates generally to touch sensing devices used in portable electronic devices. More particularly, the present invention relates to an improved mutual capacitance sensing touch device.

2. Description of the Related Art

There are many factors that determine the size of compact portable electronic devices such as laptops, PDAs, media players, cell phones, etc. In most cases, the size of the portable electronic device is limited by the size of the operational components used therein. These components include for example microprocessor chips, printed circuit boards, displays, memory chips, hard drives, batteries, interconnectivity circuitry, indicators, input mechanisms and the like. As such, there is a desired to make these operational components smaller and smaller while maintaining or increasing their power and functionality to perform operations as well as decreasing their cost. The placement of these components inside the electronic device is also a factor in determining the size of the portable electronic device. For thin devices such as cell phones, PDAs and media players, stacking operational components on top of each other is limited and therefore the operational components may be placed side by side. In some cases, the operational components may even communicate through wires or flex circuits so that they may be spaced apart from one another (e.g., not stacked).

There exist today many styles of input mechanisms for performing operations in a portable electronic device. The operations generally correspond to moving objects and making selections. By way of example, the input devices may include buttons, keys, dials, wheels, mice, trackballs, touch pads, joy sticks, touch screens and the like. Touch devices such as touch buttons, touch pads and touch screens are becoming increasingly popular in portable electronic devices because of their ease and versatility of operation, their declining price as well as their space saving ability (e.g., planarity). Touch devices allow a user to make selections and move objects by simply moving their finger (or stylus) relative to a touch sensing surface. In general, the touch device recognizes a touch and in some circumstances the characteristics of the touch and a host controller of the portable electronic device interprets the touch data and thereafter performs action based on the touch data.

There are several types of technologies for implementing a touch device including for example resistive, capacitive, infrared, surface acoustic wave, electromagnetic, near field imaging, etc.

Capacitive touch sensing devices have been found to work particularly well in portable electronic devices. Generally speaking, whenever two electrically conductive members come close to one another without actually touching, their electric field interact to form capacitance. In the case of a capacitive touch device, as an object such as a finger approaches the touch sensing surface, a tiny capacitance forms between the object and the sensing points in close proximity to the object. By detecting changes in capacitance at each of the sensing points and noting the position of the sensing points, the sensing circuit can recognize multiple objects and determine the location, pressure, direction speed and acceleration of the object as it is moved across the touch surface.

Although capacitive sensing devices have been found to work particularly well in portable electronic devices, improvements to form, feel and functionality are still desired. For example, improvements that help produce a better portable electronic device.

SUMMARY OF THE INVENTION

The invention relates, in one embodiment, to a touch sensing device. The touch sensing device includes a mutual capacitive sensing controller having a plurality of distinct drive lines and a plurality of distinct sense lines, a source for driving a current or voltage separately though each drive line, a mutual capacitance sensing circuit that monitors the capacitance at the sensing lines. The touch sensing device also includes a plurality of independent and spatially distinct mutual capacitive sensing nodes set up in a non two dimensional array. Each node includes a drive electrode that is spatially separated from a sense electrode. The drive electrode is coupled to one of the drive lines and the sense electrode is coupled to one of the sense lines. Each node is set up with a different combination of drive and sense line coupled thereto.

The invention relates, in another embodiment, to a touch sensing device that operates via mutual capacitance. The touch sensing device includes a mutual capacitance sensing node including a drive electrode that is spatially separated and juxtaposed next to a sense electrode. The drive electrode is coupled to a drive line and the sense electrode is coupled to a sense line of a mutual capacitance sensing circuit.

The invention relates, in another embodiment, to a mutual capacitive sensing method. The method includes separately driving a voltage or current through each drive line. The method also includes capacitively coupling current between drive electrodes that are coupled to driven drive line and corresponding sense electrodes that are coupled to sense lines. The method further includes detecting capacitance at electrode pairs through each sense line each time a drive line is driven. The method additionally includes determining which electrode pairs have been touched based on detected capacitance. Moreover, the method includes performing actions based on which electrode pairs have been touched.

BRIEF DESCRIPTION OF THE DRAWINGS

The invention may best be understood by reference to the following description taken in conjunction with the accompanying drawings in which.

DETAILED DESCRIPTION OF THE INVENTION

Figure 1:
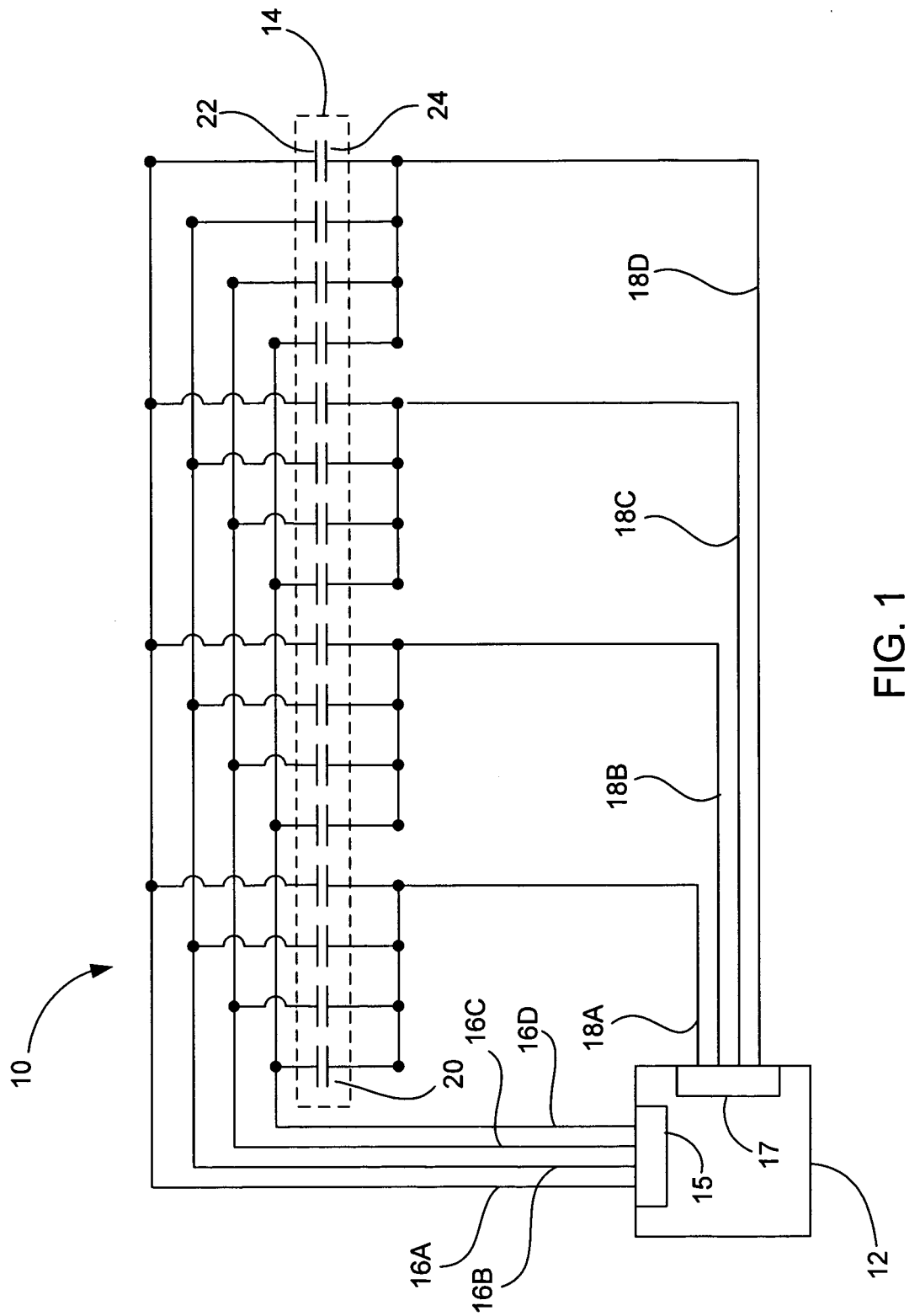
FIG. 1 is a circuit diagram of a mutual capacitive sensing input device, in accordance with one embodiment of the present invention.

The simplicity of capacitance allows for a great deal of flexibility in design and construction of the sensing device. By way of example, the sensing device may be based on self capacitance or mutual capacitance.

In self capacitance, each of the sensing points is provided by an individually charged electrode. As an object approaches the surface of the touch device, the object capacitively couples to those electrodes in close proximity of the object thereby stealing charge away from the electrodes. The amount of charge in each of the electrodes are measured by the sensing circuit to determine the positions of objects as they touch the touch sensitive surface.

In mutual capacitance, the sensing device typically includes a two-layer grid of spatially separated wires. In the simplest case, the upper layer includes lines in rows while the lower layer includes lines in columns (orthogonal). The sensing points are provided at the intersections of the rows and columns. During operation, the rows are charged and the charge capacitively couples to the columns at the intersection. As an object approaches the surface of the touch device, the object capacitively couples to the rows at the intersections in close proximity to the object thereby stealing charge away from the rows and therefore the columns as well. The amount of charge in each of the columns is measured by the sensing circuit to determine the positions of multiple objects when they touch the touch sensitive surface.

Each of these capacitive sensing methodologies has advantages and disadvantages that must be taken into account when designing a capacitive touch input device. For example, while self capacitance may be arranged in a wide variety of orientations (both 2D and non 2D arrays), they tend to produce a large number of I/O contacts especially as the resolution of the touch pad is increased (each electrode requires a separate I/O contact). The large number of I/O contacts create design difficulties especially in portable devices that are small. For example, they may require large chips and/or additional chips in order to process the large number of I/O contacts. These chips however take up valuable space inside the device and create stack up such that the device needs to be made larger to accommodate the chip(s). Furthermore, routing the I/O through traces from the electrodes to the chips may further exacerbate this problem as well as create new ones.

Unlike self capacitance, mutual capacitance can reduce the number of I/Os for the same resolution (sometimes by a factor of two). However, conventional mutual capacitance circuits are fixed to a 2D array of rows and columns (e.g., x and y) thus preventing uniquely shaped touch surfaces (e.g., non 2D arrays). Furthermore, while rows and columns that are used in mutual capacitive sensing circuits may be well suited for tracking or pointing, this arrangement may not be as well suited for other less complicated tasks associated with some application specific portable electronic devices. This is especially true when you consider the desire to maintain a small form factor with limited I/O contacts. Examples of less complicated tasks may include for example selection tasks such as buttoning and object movement tasks such as scrolling. Another problem with mutual capacitance may be in its accuracy due to parasitic capacitance that can be created using this methodology. Yet another problem with both technologies may be that they are only capable of reporting a single point when multiple objects are placed on the sensing surface. That is, they lack the ability to track multiple points of contact simultaneously.

The invention therefore pertains to improved features for touch devices used in portable electronic devices and more particularly touch devices that are based on capacitance. One aspect of the invention relates to a mutual capacitive sensing touch device that includes capacitive sensing nodes that reduce the number of I/O contacts and that are capable of being positioned in any orientation (e.g., 2D arrays are not a requirement). In fact, in one implementation, the capacitive sensing nodes are placed in a non 2D array. This presents a paradigm shift in the way that designers think about mutual capacitive sensing touch devices. In one example, the capacitive sensing nodes are positioned at angular positions in a circular manner.

These and other embodiments of the invention are discussed below with reference to FIGS. 1-18. However, those skilled in the art will readily appreciate that the detailed description given herein with respect to these figures is for explanatory purposes as the invention extends beyond these limited embodiments.

FIG. 1 is a circuit diagram of a mutual capacitive touch sensing input device 10, in accordance with one embodiment of the present invention. The mutual capacitive touch sensing input device 10 is configured to utilize a limited number of I/O contacts while maximizing its resolution, minimizing its size, and providing a multiplicity of orientations including non 2D arrays. Because of this, the input device may for example be placed in a variety of portable electronic devices and serve a wide variety of functions including for example scrolling, parameter control and buttoning. In fact, the input device works particularly well in small compact handheld devices such as cell phones and media players (e.g., music players, game players, video players, etc.).

The input device 10 includes a mutual capacitive sensing controller 12 that communicates with a touch sensitive element 14. The touch sensitive element 14 includes a plurality of independent and spatially distinct mutual capacitive sensing nodes 20 that are positioned about a touch surface of the touch sensitive element 14. The nodes 20 are dispersed such that each node 20 represents a different position on the touch surface. During operation, each of the mutual capacitive sensing nodes 20 produces a capacitance, and the mutual capacitive sensing controller 12 detects changes in the capacitance at each of the nodes 20. This information is used to determine touch events. In most cases, the nodes 20 are electrically coupled to the sensing controller 12 through traces or other well-known routing technologies such as those associated with printed circuit boards, flex circuits and integrated chips.

The touch sensitive element 14 can be widely varied. In some cases, it is mounted to or within a housing of the portable electronic device. For example, the element 14 may be utilized in a touch pad that is mounted within an opening in the housing of the portable electronic device. The touch pad may be a fixed to the portable electronic device or it may be movable so as to engage one or more actuators such as switches. In other cases, the touch sensitive element 14 is a thin layer applied over a component of the portable electronic device including for example the housing or a display of the portable electronic device. By way of example, the element 14 may be used to create a touch screen (e.g., over laid on top of a display). The touch screen may be a fixed to the portable electronic device or it may be movable so as to engage one or more actuators such as switches. Alternatively, the element 14 may be a portion of the housing (e.g., nodes are embedded inside the housing or adhered to the inside surface of the housing of the portable electronic device). Examples of various ways of situating the touch sensitive element 14 relative to an electronic device can be found in U.S. patent application Ser. Nos. 10/188,182, 10/722,948, 10/643,256, 10/840,862, 11/057,050 and 11/115,539, which are herein incorporated by reference.

The mutual capacitive sensing controller 12 can also be widely varied. In some cases, the mutual capacitive sensing controller 12 is a separate controller that is operatively coupled to a host controller of a portable electronic device (e.g., for example using a flex circuit or printed circuit board). In other cases the controller 12 is integrated into the host controller of the electronic device. That is, the sensing controller 12 is part of the host controller. Integration may be possible due to the reduced number of I/O contacts required by mutual capacitance technology.

Referring to FIG. 1, the mutual capacitive sensing controller 12 communicates with the nodes 20 via a plurality of distinct drive lines 16 and a number of distinct sense lines 18. The drive lines 16 are configured to carry current from the controller 12 to the mutual capacitive coupling nodes 20 and the sensing lines 18 are configured to carry a current from the mutual capacitive coupling nodes 20 to the capacitive controller 12. The drives lines 16 capacitively couple to each of the sense lines 18 at the plurality of capacitive sensing nodes 20. Each node 20 is set up with a different combination of drive and sense line 16 and 18. For example, in the illustrated embodiment, the circuit 10 includes four drive lines 16 and four sense lines 18 thereby forming sixteen individual nodes 20. The number of nodes 20 is typically the number of drive lines multiplied by the number of sense lines. In some cases, the nodes are formed by an equal number of drive lines and sense lines. For example, the circuit may include the following arrangement of drive/sense-nodes, 2/2-4, 3/3-9, 4/4-16, 5/5-25, 6/6-36, 7/7-49, 8/8-64, 9/9-81, 10/10-100, and so on. In other cases, the nodes are formed by a different number of drive and sense lines. For example, the circuit may include the following arrangement of drive/sense-nodes 2/3-6, 3/5-15, 4/6-24, 5/8-40, 7/9-63, 9/10-90, and so on. It should be further pointed out that in some limited circumstances, the nodes may not equal the number of drive lines multiplied by the number of sense lines. For example, the number of nodes may be smaller than this number. This may be done in cases where the required number of nodes is a primary number [e.g., the designer simply does not make a node(s) even though there is a drive line(s) and sense line(s) to do so]. Accordingly, any number of nodes may be produced.

As shown, the drive lines 16 are connected to a voltage source 15 that separately drives the current through each of the driving lines 16. That is, the stimulus is only happening over one line while all the other lines are grounded. They may be driven similar to a raster scan. The sensing lines 18, on the other hand, are connected to a mutual capacitive sensing circuit 17 that monitors the sensing lines 18. In one embodiment, this is accomplished with independent sensing circuits that each monitor an individual sensing line. In this manner, the mutual capacitive sensing circuit 17 is capable of continuously monitoring the sensing lines 18 at the same time. That is, the mutual capacitive sensing circuit 17 is always monitoring the capacitance through the sensing lines 18. In another embodiment, instead of the sensing lines being all read at the same time by independent circuits, the sensing lines may be sequentially switched to a common sensing circuit and read one after the other (e.g., multiplexing). This tends to reduce the silicon area of the chip but it also increases the scanning time.

Although not shown in great detail in FIG. 1, each node 20 includes a drive electrode 22 coupled to one of the drive lines 16 and a sense electrode 24 coupled to one of the sense. This may for example be accomplished via traces or other related circuitry. The electrodes 22 and 24 are spatially separated and therefore cooperate to capacitively couple a charge therethrough. The electrodes 22 and 24 may be arranged in a variety of ways. In one implementation, the electrodes 22 and 24 are plates that are juxtaposed next to one another in a side-by-side relationship thereby creating fringe fields when the drive electrode 22 is driven. In another implementation, the spaced apart electrodes 22 and 24 are disposed below an electrically isolated "floating" electrode. These and other embodiments will be described below.

Unlike conventional mutual capacitance devices, which have nodes that are fixed to intersection points of upper rows and lower columns, the electrode arrangement disclosed herein allows each node 20 to be placed at any location within a touch surface. This is similar to self capacitance technology that utilizes individual electrodes at each node. However, unlike self capacitance technology, the mutual capacitance technology reduces the number of I/O contacts required for the desired number of nodes. In self capacitance, each node includes a distinct I/O contact and therefore to achieve sixteen nodes, at least seventeen I/O contacts are needed (one is for return ground). In essence, the invention described herein provides the benefits of each type of technology (e.g., nodes that can be placed anywhere while limiting the number of I/O contacts for a given resolution). Furthermore, although the nodes 20 are typically placed on a planar surface, in some circumstances the nodes 20 may be placed on a contoured surface. Moreover, the nodes 20 may be placed on multiple surfaces such as multiple sides of a portable electronic device.

Because the node location is not limited, the nodes 20 may be positioned in a conventional 2D array of rows and columns or alternatively they may be positioned in a non 2D array thereby allowing a wide variety of user interfaces to be created. In fact, non 2D arrays may be beneficial in creating user interfaces that better fit portable electronic devices. For example, different orientations of nodes 20 may be used to provide input functionality that is directed at the specific applications of the portable electronic device. The user interfaces may for example include scrolling regions or parameter control regions where nodes are set up in succession along a predetermined path, and/or button regions where individual nodes may represent distinct button functions. With regards to a scrolling or parameter control, the nodes may be placed in an open loop arrangement such as a line, or they may be placed in closed loop arrangement such as a circle. Generally speaking, the nodes can be placed to form any shape whether in a single plane or multiple planes. Examples include squares, rectangles, circles, semi-circles, ovals, triangles, trapezoids, other polygons, pill shapes, S shapes, U shapes, L shapes, star shapes, plus shape, etc.

Any number of nodes 20 may be used. The number of nodes 20 is typically determined by the size of the touch device as well as the size of the electrodes 22 and 24 used at the nodes 20. In many cases, it is desirable to increase the number of nodes 20 so as to provide higher resolution (e.g., more information can be used for such things as acceleration). However, as the number increases, so does the number of I/Os. Therefore a careful balance between resolution and number of I/Os needs to be made when designing the touch device.

Furthermore, the size and shape of the nodes 20 may vary according to the specific needs of the touch device. Generally speaking, the nodes 20 can be formed from almost any shape and size. For example they may be formed as squares, rectangles, circles, semi-circles, ovals, triangles, trapezoids, other polygons and or more complicated shapes such as wedges, crescents, stars, lightning bolts, etc. In some cases, at least a portion and in some cases all the nodes 20 are identical. That is, they have the same size and shape. In other cases, at least a portion and in some cases all the nodes 20 have different sizes and/or shapes. For example, a first set of nodes 20 may have a first shape and a second set of nodes 20 may have a second shape that is different than the first shape. The configuration is typically dependent on the functionality that the touch device provides. For example, scrolling or parameter control nodes may be configured similarly within a scrolling or parameter control region, and button nodes may be configured differently than scrolling or parameter control nodes and each other. In essence, the size and shape depends on the desired functionality. If the functionality is the same then the size and shape the nodes tend to be same. If one functionality is more dominant than another functionality, then the size and shape may be matched accordingly. In some cases, the size of the nodes corresponds to about the size of a fingertip. In other cases, the size of the nodes are smaller than the size of a finger tip so as to improve the resolution of the touch device (the finger can influence two of more nodes at anyone time thereby enabling interpolation).

During operation, the controller 12 directs a voltage to be applied to each drive line 16 separately. This happens sequentially until all the lines have been driven. For example, a voltage may first be applied to the first drive line 16A, then the second drive line 16B, then the third drive line 16C and then the forth drive line 16D. Once all the lines have been driven, the sequence starts over (continuously repeats). On the other hand, in one embodiment, the capacitive sensing circuit 17 of the controller 12 senses all of the sensing lines 18 in parallel. That is, each time a drive line is driven, each of the sensing lines 18A-18D are monitored. This is typically accomplished with independent circuits. Alternatively, in another embodiment, each sense line may be monitored in sequence, to share the same sensing circuit (e.g. multiplexing each line to the sense circuit on-chip).

More particularly, because of the capacitive coupling, when a current is driven through a driving line 16, the current is carried through to the sensing lines 18A-D at each of the nodes 20 coupled to the driving line 16. The sensing circuit 17 monitors the change in capacitance that occurs at each of the nodes 20 via the sensing lines 18A-D. The positions where changes occur and possibly the magnitude of those changes are used to help recognize touch events.

When no object is present, the capacitive coupling at the node 20 stays fairly constant. When an object such as a finger is placed proximate the node 20, the capacitive coupling changes through the node 20. The object effectively shunts some of the field away so that the charge projected across the node 20 is less, i.e., the object steals charge thereby affecting the capacitance. The change in capacitive coupling changes the current that is carried by the sensing lines 18A-D. The capacitance circuit 17 notes the current change and the particular node 20 where the current change occurred and reports this information in a raw or in some processed form to the host controller of the portable electronic device.

Although not shown in great detail in FIG. 1, the circuit 17 may additionally include filters for eliminating parasitic capacitance, which may for example be created when nodes, contacts and/or routing circuitry are located closely together. Generally speaking the filter rejects stray capacitance effects so that a clean representation of the charge transferred across the node is outputted (and not anything in addition to that). That is the filter produces an output that is not dependent on the parasitic capacitance, but rather on the capacitance at the node 20. As a result, a more accurate output is produced. In one embodiment, the filters are embodied as inverting amplifiers that null the input voltage through each sense line.

Figure 2:
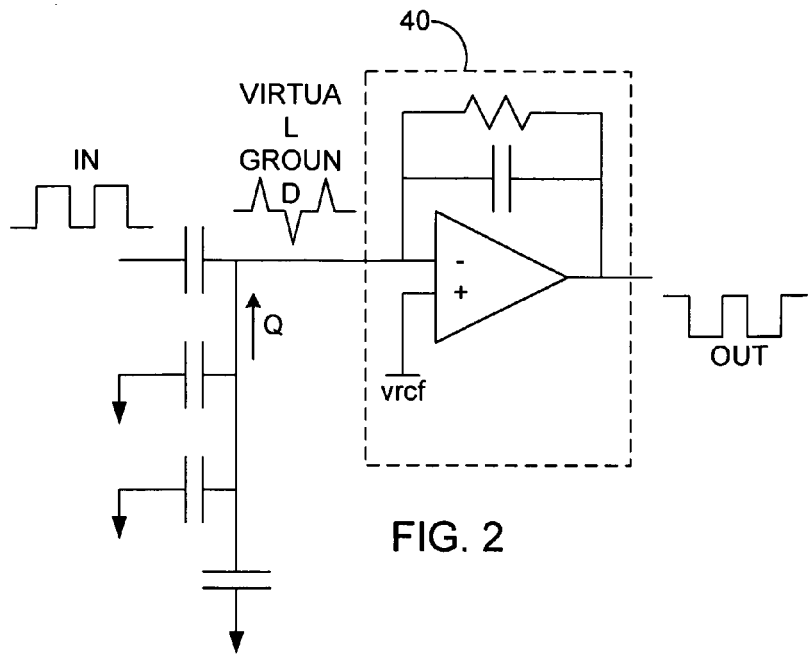
FIG. 2 is a circuit diagram of a filter arrangement of a mutual capacitance sensing circuit, in accordance with one embodiment of the present invention.

FIG. 2 is a diagram of an inverting amplifier 40, in accordance with one embodiment of the present invention. The inverting amplifier 40 may be used in the circuit 17 of FIG. 1 in order to reduce the parasitic capacitance. As shown, the inverting amplifier includes a non inverting input that is held at a constant voltage (in this case ground), an inverting input that is coupled to the node and an output that is coupled to the capacitive sensing circuit 17. The output is coupled back to the inverting input through a capacitor and/or resistor. During operation, the input from the node may be disturbed by stray capacitance effects, i.e., parasitic capacitance. If so, the inverting amplifier is configured to drive the input back to the same voltage that it had been previously before the stimulus. As such, the value of the parasitic capacitance doesn't matter.

Analyzed from the circuit standpoint, the charge Q when injected into the circuit is proportional to the change in voltage. Because the change in voltage is nulled, the input is kept at a constant voltage, and therefore the net change that goes in and out of the node is zero, which means the error signal at output of op amp is zero contribution related to the parasitics caused by other nodes.

Figure 3A:
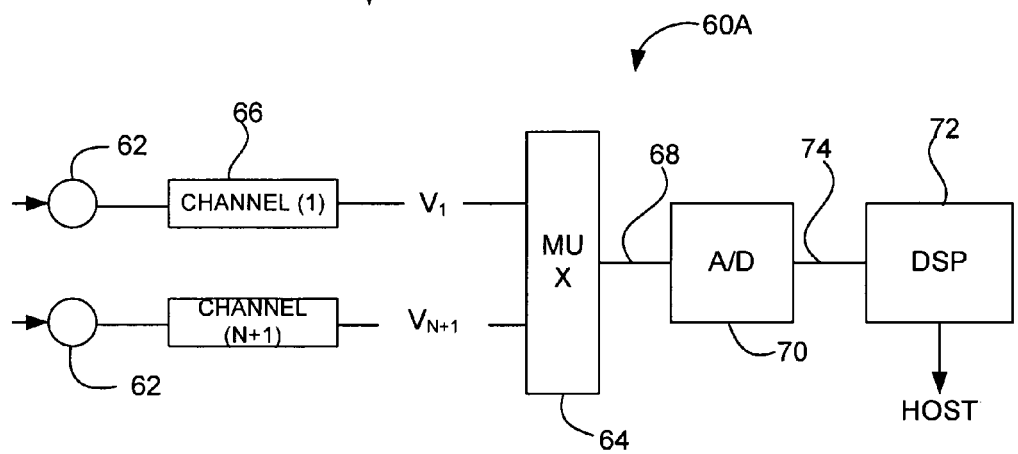
FIG. 3A is a block diagram of a mutual capacitive sensing circuit, in accordance with one embodiment of the present invention.

FIG. 3A is a block diagram of a capacitive sensing circuit 60, in accordance with one embodiment of the present invention. The capacitive sensing circuit 60 may for example correspond to the capacitive sensing circuits described in FIG. 1. The capacitive sensing circuit 60 is configured to receive input data from a plurality of sensing points 62 (electrode, nodes, etc.), to process the data and to output processed data to a host controller.

The sensing circuit 60 includes a multiplexer 64 (MUX). The multiplexer 64 is a switch configured to perform time multiplexing. As shown, the MUX 64 includes a plurality of independent input channels 66 for receiving signals from each of the sensing points 62 at the same time. The MUX 64 stores all of the incoming signals at the same time, but sequentially releases them one at a time through an output channel 68.

The sensing circuit 60 also includes an analog to digital converter 70 (ADC) operatively coupled to the MUX 64 through the output channel 68. The ADC 70 is configured to digitize the incoming analog signals sequentially one at a time. That is, the ADC 70 converts each of the incoming analog signals into outgoing digital signals. The input to the ADC 70 generally corresponds to a voltage having a theoretically infinite number of values. The voltage varies according to the amount of capacitive coupling at each of the sensing points 62. The output to the ADC 70, on the other hand, has a defined number of states. The states generally have predictable exact voltages or currents.

The sensing circuit 60 also includes a digital signal processor 72 (DSP) operatively coupled to the ADC 70 through another channel 74. The DSP 72 is a programmable computer processing unit that works to clarify or standardize the digital signals via high speed mathematical processing. The DSP 74 is capable of differentiating between human made signals, which have order, and noise, which is inherently chaotic. In most cases, the DSP performs filtering and conversion algorithms using the raw data. By way of example, the DSP may filter noise events from the raw data, calculate the touch boundaries for each touch that occurs on the touch screen at the same time, and thereafter determine the coordinates for each touch event. The coordinates of the touch events may then be reported to a host controller where they can be compared to previous coordinates of the touch events to determine what action to perform in the host device.

Figure 3B:
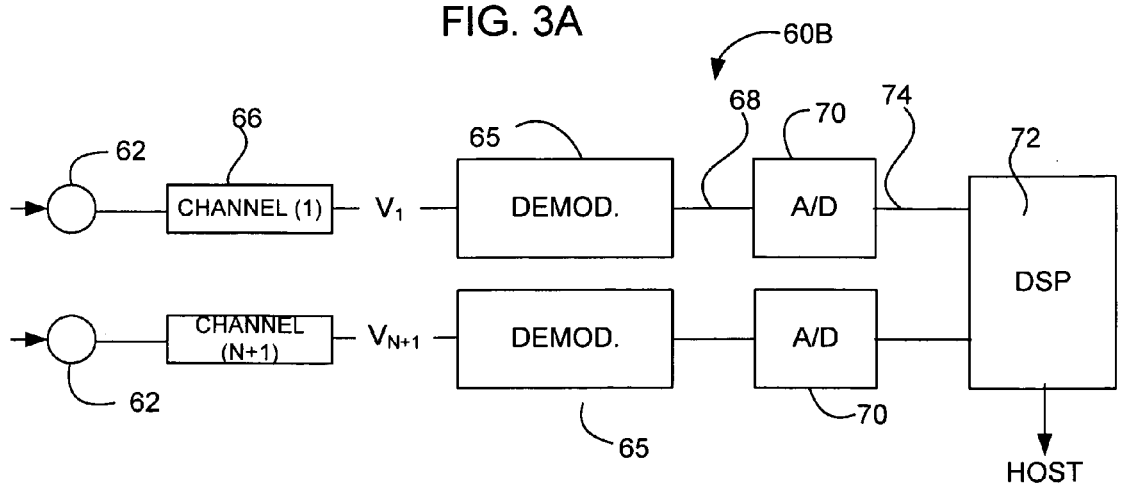
FIG. 3B is a block diagram of a mutual capacitive sensing circuit, in accordance with one embodiment of the present invention.

Another embodiment of the capacitive sensing circuit is shown in FIG. 3B. This embodiment is similar to FIG. 3A, but more simplified. In this embodiment, channel is followed by its own dedicated demodulator and A/D converter. The demodulator is basically an analog multiplier with one input tied to the pulse generator signal, and the other input tied to the output of the channel charge amplifier. The output of the demodulator feeds the A/D converter, which is a delta-sigma type of converter.

In one implementation of this embodiment, the circuit waits until a timer (or host controller) indicates that a sensing cycle should begin. Thereafter, a pulse train is sent to the first drive line (e.g., 12 pulses which are each 3 uS period). Then, synchronous charge coupling is sensed on all sense lines. This may for example be accomplished by demodulating the charge transferred to the sense lines using the pulse train phase and frequency reference. Thereafter, an A/D conversion is performed on the sensed synchronous charge transfer for each sense line. Then, each data is associated with the specific capacitor being sensed, which is identified by the combination of the particular drive line and sense line which are connected to the capacitor of interest. Then, the data from the A/D converter is signal processed using techniques such as baseline subtraction, low pass filter, etc. Thereafter, the processed data is communicated to the host, or is act on in an appropriate manner. This method may be repeated for each drive line.

A variety of nodes that can be utilized in the embodiments described above will now be described in conjunction with FIGS. 4-7. It should be appreciated that this are given by way of example and not by way of limitation as the invention can extend beyond these limited embodiments.

Figure 4:
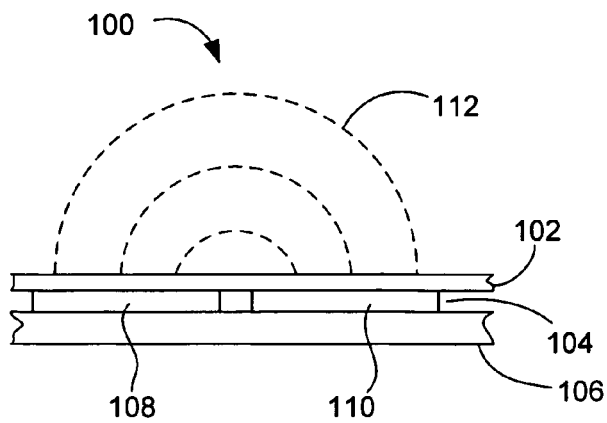
FIG. 4 is a diagram of a mutual capacitive sensing node, in accordance with one embodiment of the present invention.

FIG. 4 is a diagram of a mutual capacitive sensing node 100, in accordance with one embodiment of the present invention. The node 100 is formed from various layers including a cover film 102, an electrode layer 104 and a substrate 106. The cover film 102 is disposed over the electrode layer 104 and the electrode layer 104 is disposed over the substrate 106. The electrode layer 104 includes a drive electrode 108 and a sense electrode 110 that are spaced apart from one another in order to electrically isolate them from each other. The drive electrode 108 is coupled to a drive line and the sense electrode 110 is coupled to a sense line. When the drive electrode 108 is driven with a voltage or current, the voltage or current is capacitively coupled to the sense electrode 110 via fringe fields 112 that come up through the cover film 102. When an object is placed over the node 100, the finger shortcuts or steals some of the field lines 112 away effectively reducing the capacitance that is coupled through the node 100.

The electrodes 108 and 110 may be formed from almost any shape and size. For example they may be formed as squares, rectangles, circles, semi-circles, ovals, triangles, trapezoids, other polygons and or more complicated shapes such as wedges, crescents, stars, lightning bolts, etc. The size and shape of the electrodes 108 and 110 typically depends on the size and shape of the node 100. In some cases, the electrodes 108 and 110 are equal pairs having the same size and shape. For example, the node 100 may be divided equally in half. In other cases, the electrodes 108 and 110 are disparate pairs having different sizes and/or shapes. For example, the drive electrode 108 may have a first size and/or shape and the sense electrode 110 may have a second size and/or shape that is different than the first shape. By way of example, it may be beneficial to have a larger drive electrode and a smaller sense electrode (or vice versa).

Figure 5:
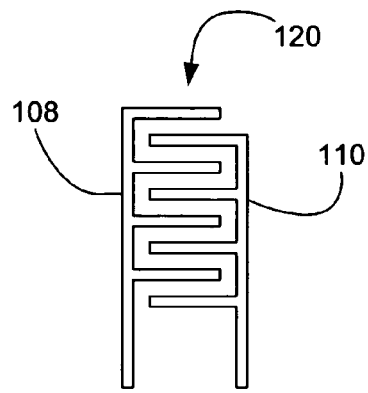
FIG. 5 is a diagram of a mutual capacitive sensing node, in accordance with one embodiment of the present invention.

FIG. 5 is a diagram of a mutual capacitive sensing node 120, in accordance with one embodiment of the present invention. The node 120 is similar to the node 100 described in FIG. 4 except that the drive electrode 108 and sense electrode 110 are interleaved rather than being juxtaposed plates.

Figure 6:
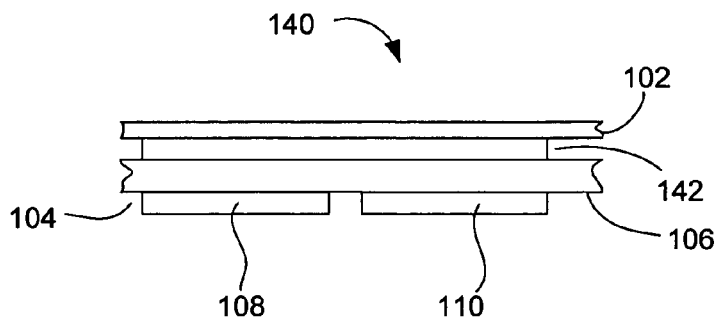
FIG. 6 is a diagram of a mutual capacitive sensing node, in accordance with one embodiment of the present invention.

FIG. 6 is a diagram of a mutual capacitive sensing node 140, in accordance with one embodiment of the present invention. The node 140 is similar to the nodes 100 or 120 described in FIGS. 4 and 5 in that it uses spaced apart electrodes 108 and 110. However, unlike the embodiments described above, the node 140 further includes a floating (electrically isolated) electrode 142 disposed above the electrode pairs 108 and 110. As shown, the drive and sense electrodes 108 and 110 are disposed underneath a substrate 106, and the floating electrode 142 is disposed over the substrate 106. Furthermore, the cover film 102 is disposed over the floating electrode 142. In this embodiment, the driving current is capacitively coupled to the floating electrode from the driving electrode 108 then its capacitively coupled to the sense electrode 110. Moreover, the outer dimension of the floating electrode 142 typically matches the outer dimensions of the electrode pairs 108 and 110, although in some circumstances it may be desirable to make the outer dimension of the floating electrode 142 smaller or larger than the outer dimension of the electrode pairs 108/110.

Figure 7A:
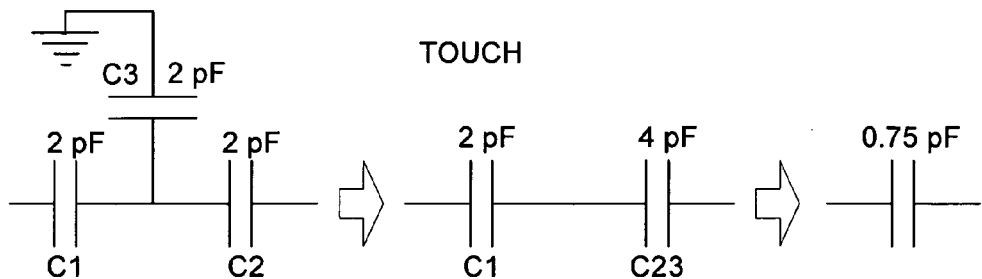
FIGS. 7A and 7B show the embodiment of FIG. 6 in circuit diagram form, in accordance with one embodiment of the present invention.
Figure 7B:
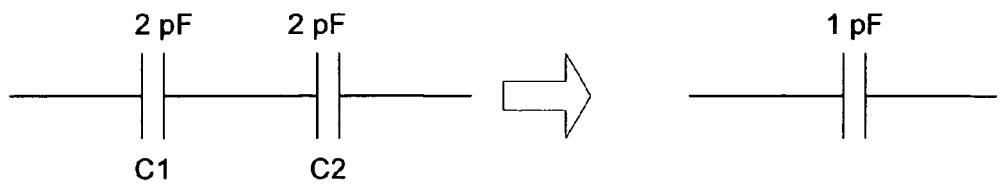

FIGS. 7A and 7B show the embodiment of FIG. 6 in circuit diagram form. In this illustration, C1 is the capacitance between the drive electrode 108 and the floating electrode 142, C2 is the capacitance between the floating electrode 142 and the sense electrode 110, and C3 is the capacitance between a finger 144 and the floating electrode 142. C3 is the only capacitance that changes (only exists when a finger or other related object is present).

For illustration purposes, assume that a typical value for C1 is 2 pF, C2 is 2 pF and C3 is 2 pF. When there is no touch, the capacitance C1 and C2 are placed in series thereby creating a total net capacitance of 1 pF. This capacitance is fed through a sense line and read by the capacitance sensing circuit. When there is a touch, the capacitance C2 and C3 are first combined together (because the sense electrode is held at virtual ground) then the capacitance C1 (2 pF) and C23 (4 pF) are placed in series thereby creating a total net capacitance of (4 pF*2 pF)/(4 pF+2 pF)=⅔ pF. However, the total charge transfer is split equally between C2 and C3, so the charge transfer through C2 is ½ of the total, or ⅔ pF. This capacitance is fed through a sense line and read by the capacitance sensing circuit. The capacitance sensing circuit differentiates between a no touch and a touch by checking these values (e.g., no touch=1 pF, touch=something other than 1 pF). The value of the capacitance for a touch may further be used to determine touch pressure as the capacitance typically changes with increased pressure.

Referring to all the node designs mentioned above (FIGS. 4-7), the substrate 106 may for example be a printed circuit board or a flexible membrane such as those of a flex circuit or some other suitable material for supporting the electrodes 108 and 110 thereon (e.g., housing of portable electronic device). Furthermore, the electrodes 108 and 110 may be formed from any thin conductive material. By way of example, the electrodes 108 and 110 may be embodied as a metallic foil that is adhered to the substrate 106, a conductive paint or ink that is coated on the substrate 106, a conductive material that is printed, deposited or etched on the substrate 106, plates or bands that are molded or embedded into the substrate 106 or any other suitable arrangement. Moreover, the cover film 102 may be formed from any suitable dielectric material such as glass or plastic. The cover film 102 serves to protect the underlayers and provide a surface for allowing an object to slide thereon. The cover film 102 also provides an insulating layer between the object and the electrode layer 104. Furthermore, the cover film 102 is suitable thin to allow sufficient electrode coupling.

In some cases, the various layers may further be embodied as transparent or semi transparent materials. For example, the conductive material of the electrodes may be formed from indium tin oxide (ITO), the dielectric material of the film may be formed as clear or partially transparent plastic or glass, and the substrate may be formed as clear or partially transparent plastic or glass (e.g., clear Mylar sheet). This may be done to allow visual feedback through the various layers of the touch device.

Moreover, the electrode layer 104 may include interconnects for coupling the electrodes 108 and 110 to the driving and sensing lines. Alternatively, the driving and sensing lines may be formed with the electrodes 108 and 110 in the same step/layer.

In one implementation, the electrodes are placed on one side of a printed circuit board (PCB), and the mutual capacitance sensing circuit in the form an integrated circuit chip is mounted on the back side of the chip, with conventional PCB routing connecting the I/O contacts of the electrodes to the I/O contacts of the IC chip. The IC chip may for example be an ASIC. In another implementation, the electrodes are placed on one side of a printed circuit board (PCB) and the I/O contacts are coupled to the I/O contacts of a floating IC via a flex circuit with printed traces (sensing and driving lines). For example, the PCB containing the electrodes is connected to one end of a flex circuit and the sensor IC is attached to the other end of the flex circuit. Alternatively, the electrodes may be applied directly to the flexible member of the flex circuit.

Several touch devices 200-280 with nodes 202 set up in a non 2D array will now be described in conjunction with FIGS. 8-15. It should be appreciated that this are given by way of example and not by way of limitation as the invention can extend beyond these limited embodiments.

In most of these embodiments, the touch devices includes a plurality of nodes 202 that are positioned side by side along a predetermined path. This arrangement works particularly well for performing scrolling operations or parameter control operations. The path may be a closed loop path or an opened loop path. Furthermore, each of the nodes 202 include an electrode pair of drive electrode 204 and sense electrode 206. Moreover, the number of drive lines 208 is equal to the number of sense lines 210, and further the number of nodes 202 is the square of this number. It should be appreciated however that this is not a limitation.

Figure 8:
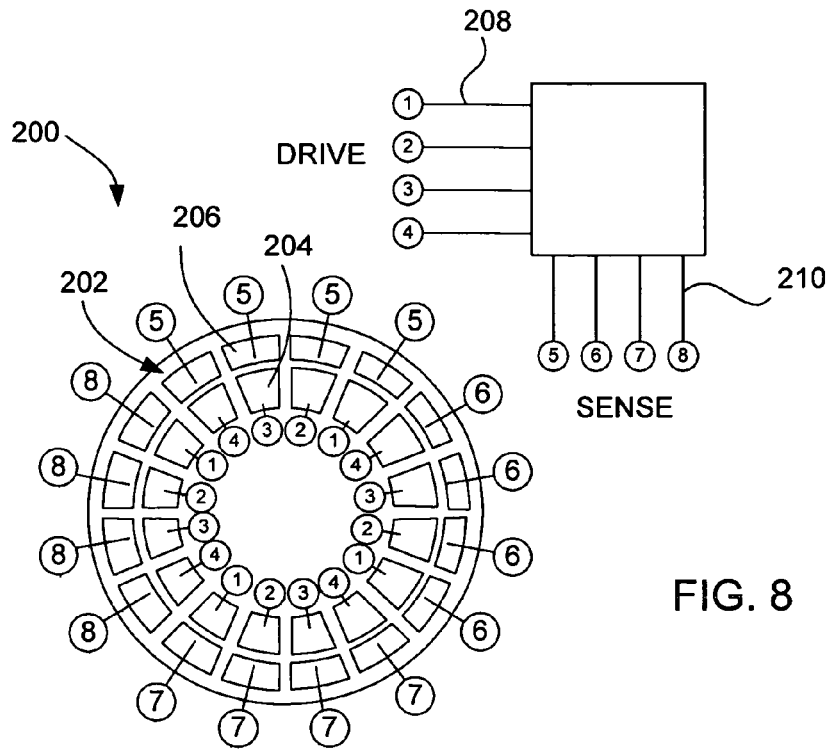
FIG. 8 is a diagram of a circular touch device, in accordance with one embodiment of the present invention.

FIG. 8 is a diagram of a circular touch device 200. The circular touch device 200 is divided into several independent and spatially distinct nodes 202 that are positioned in a circular manner. Each of the nodes 202 represents a different angular position within the circular shape. Although not shown, the nodes may also be placed at radial locations from the center of the touch surface to the perimeter of the touch surface.

Figure 9:
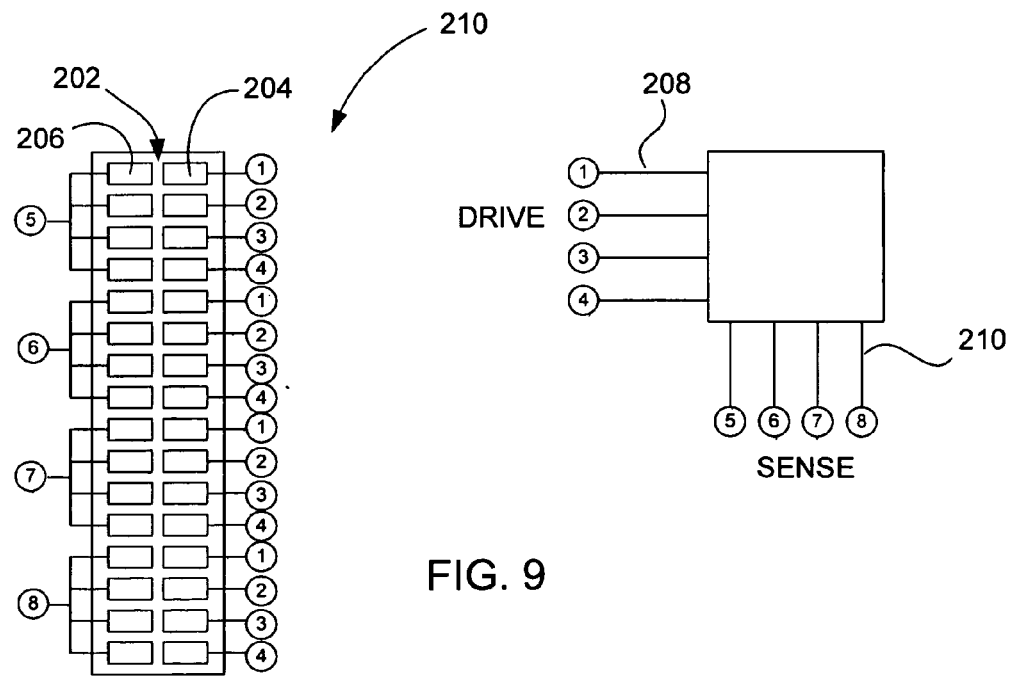
FIG. 9 is a diagram of a linear touch device, in accordance with one embodiment of the present invention.

FIG. 9 is a diagram of a linear touch device 220. The linear touch device 220 is divided into several independent and spatially distinct nodes 202 that are positioned next to one another along a straight line. Each of the nodes 202 represents a different linear position. Although shown vertical, it should be appreciated that the linear touch device may also be horizontal or at an angle. Moreover, although shown straight, in some cases it may be desirable to use a curved line such as one that is U shaped, S shaped, etc.

Figure 10:
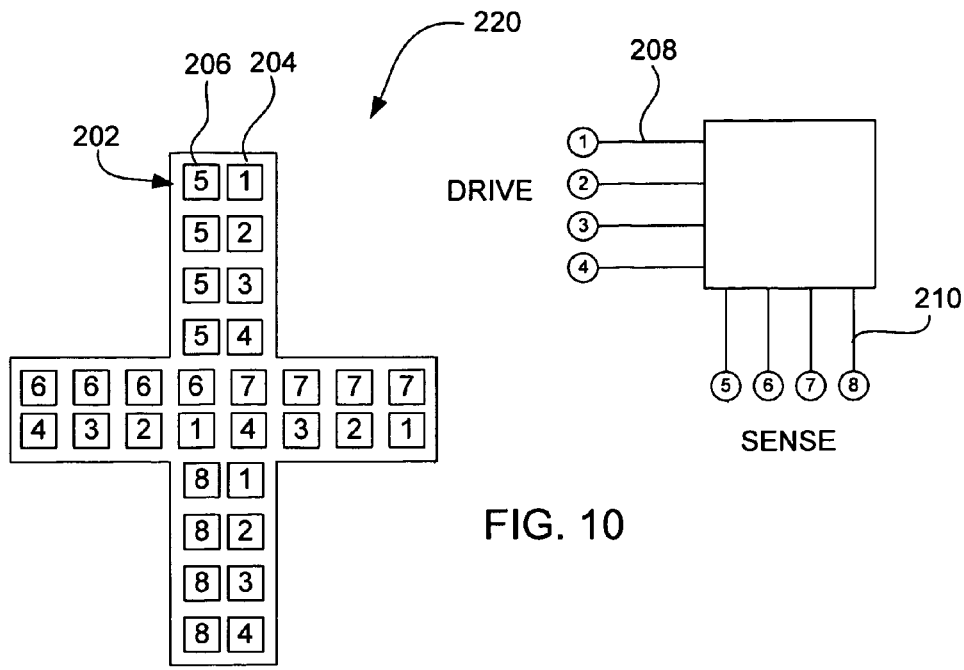
FIG. 10 is a diagram of another type of linear touch device, in accordance with one embodiment of the present invention.

FIG. 10 is a diagram of another type of linear touch device 230. The linear touch device 250 is divided into several independent and spatially distinct nodes 202 that are positioned in the form of a "+" shape. This embodiment includes both a horizontal line and a vertical line that cross each other.

Figure 11:
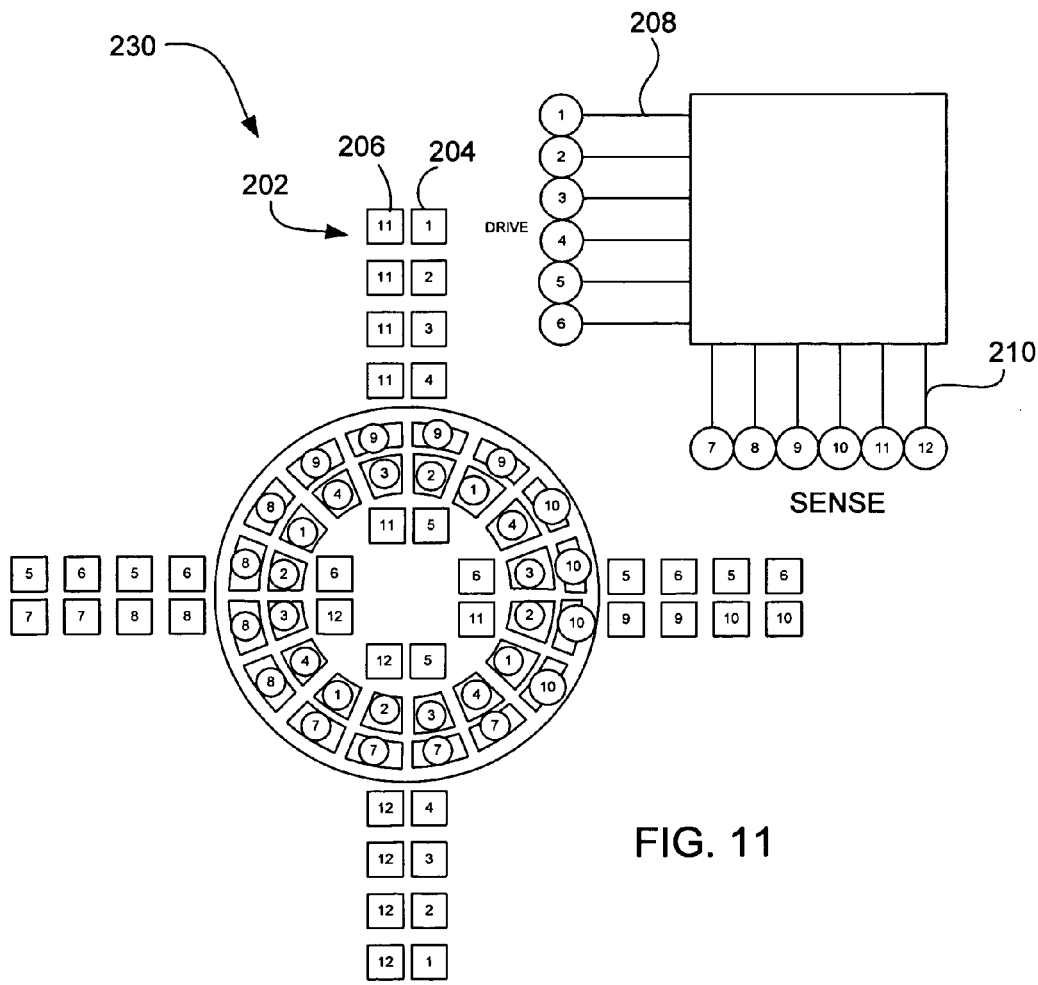
FIG. 11 is a diagram of a combined touch device, in accordance with one embodiment of the present invention.

FIG. 11 is a diagram of a combined touch device 240. For example, it may combine two sets of scrolling/parameter control regions as for example the circular region described in FIG. 9 and the plus region described in FIG. 10.

Figure 12:
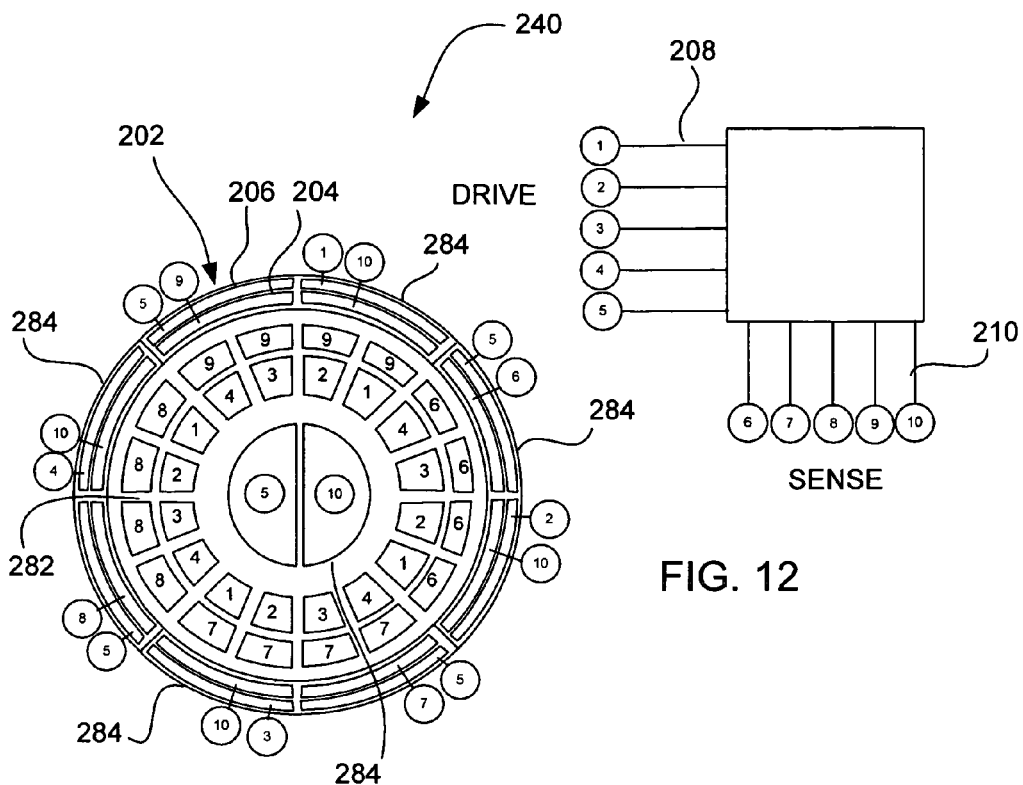
FIG. 12 is a diagram of a touch device that includes a touch region and one or more distinct buttons, in accordance with one embodiment of the present invention.
Figure 13:
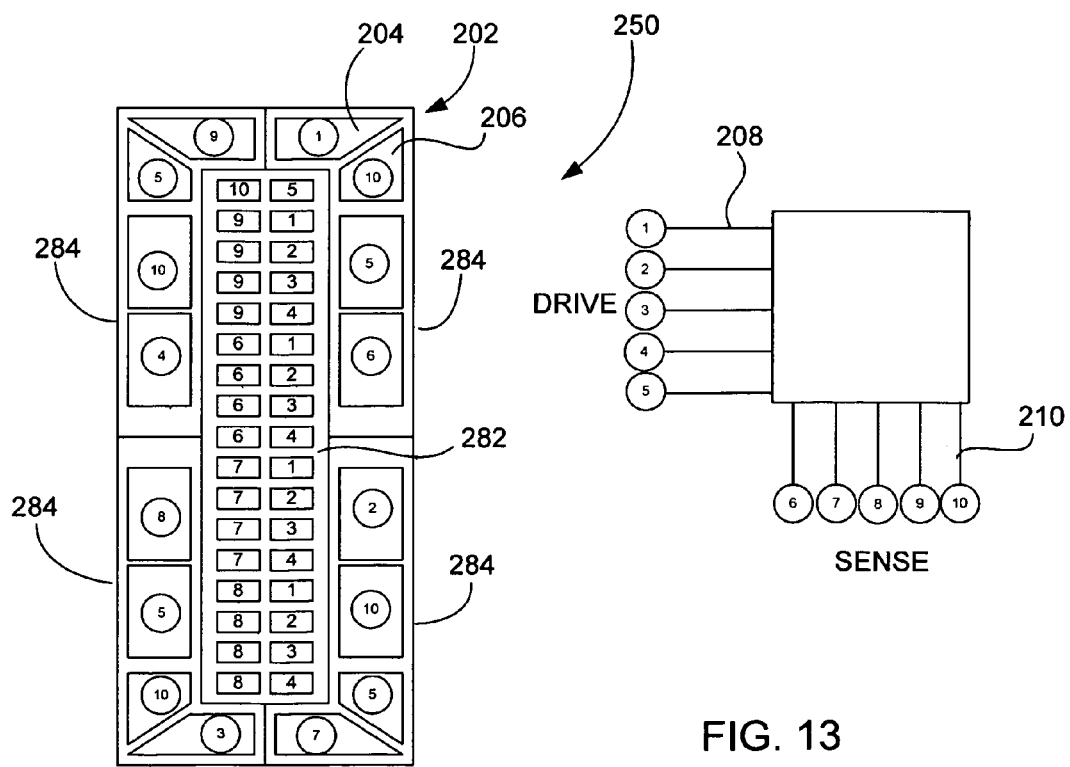
FIG. 13 is a diagram of a touch device that includes a touch region and one or more distinct buttons, in accordance with one embodiment of the present invention.
Figure 14:
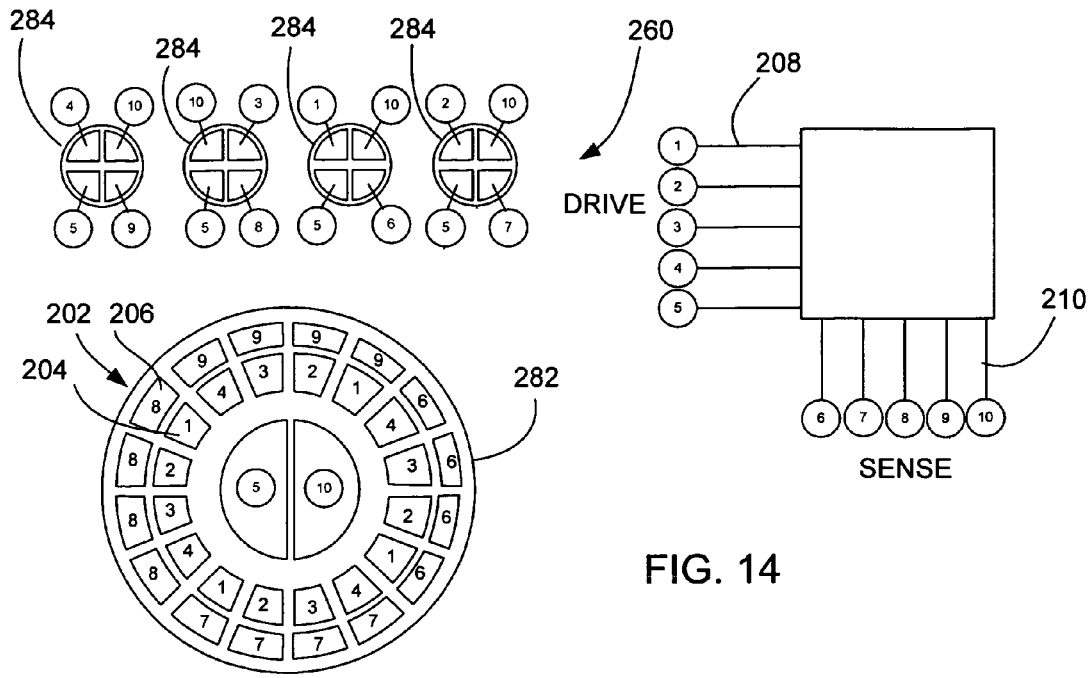
FIG. 14 is a diagram of a touch device that includes a touch region and one or more distinct buttons, in accordance with one embodiment of the present invention.

FIGS. 12-14 are diagrams of a touch devices 250-270 include a scrolling or parameter control set up 282 and one or more distinct buttons 284. The scrolling or parameter control set up 282 include nodes 202 configured similarly to any of those previously described 200-240. The buttons 284, on the other hand, include additional node(s) 202. Each button may include one or more nodes. The minimum required node is one, but in some cases it may be desirable to include multiple nodes. The buttons 284 may be positioned inside and/or outside the scrolling region 282. They may be placed in close proximity of the scrolling region 282 as for example around the periphery of the scrolling region 282 (FIGS. 12 and 13) and/or they may be placed away from the scrolling region 282 (FIG. 14).

Figure 15:
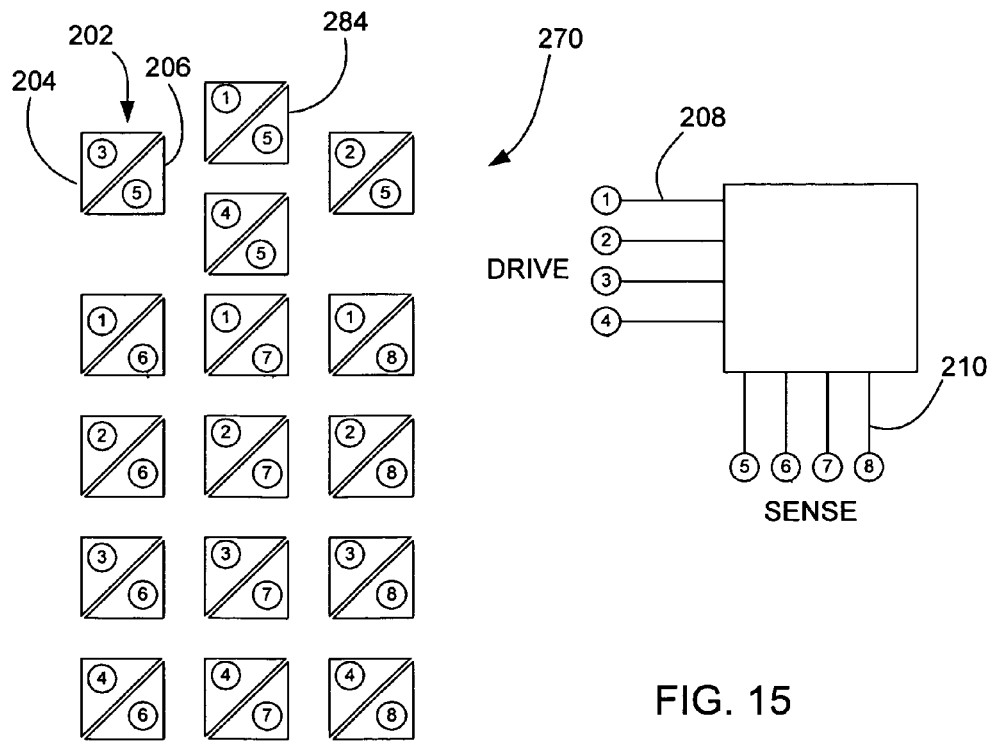
FIG. 15 is diagram of a touch device that only includes a button arrangement, in accordance with one embodiment of the present invention.

FIG. 15 is diagram of a touch device 280 that only includes a button arrangement having a plurality of buttons 284. Each button 284 has a different task or function assigned thereto. The buttons 284 may be arranged in any manner within a user interface of an electronic device.

Figure 16:
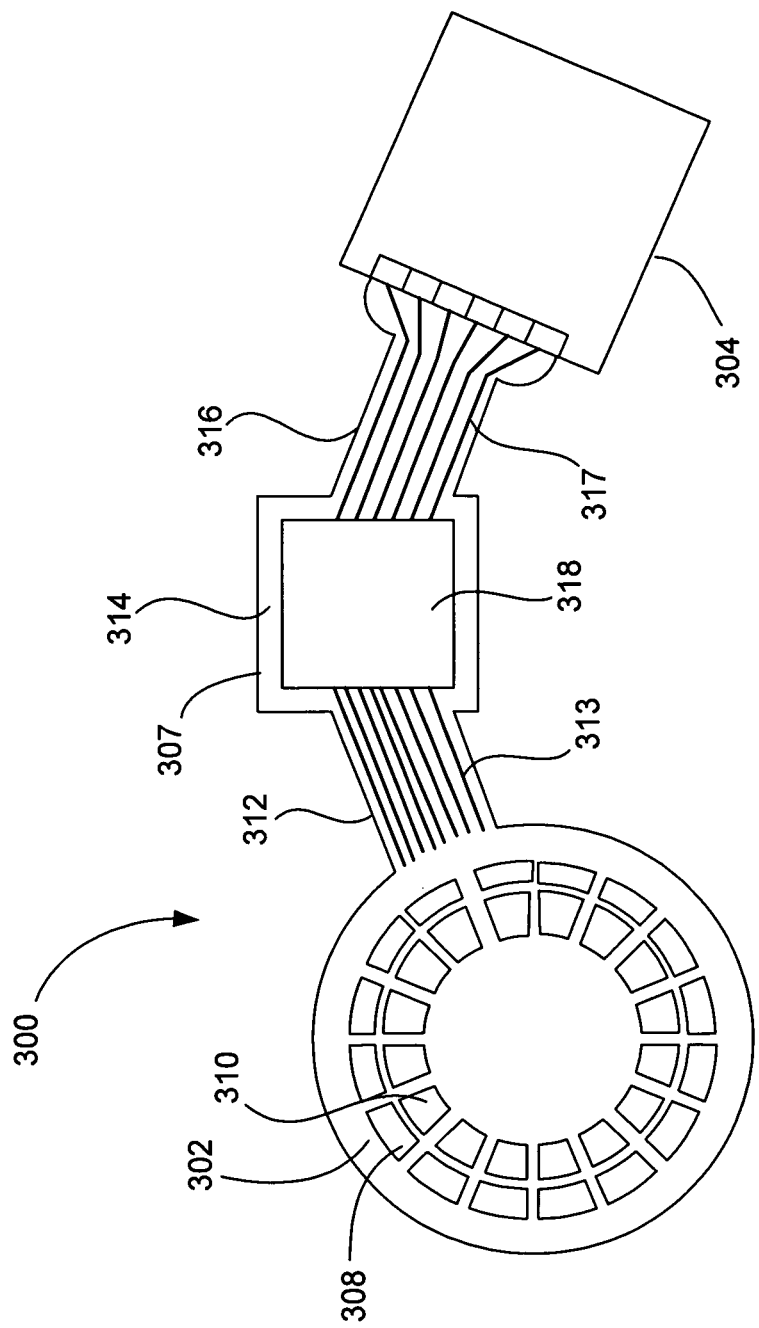
FIG. 16 is a diagram of a touch assembly, in accordance with one embodiment of the present invention.

FIG. 16 is a diagram of a touch assembly 300, in accordance with one embodiment of the present invention. The touch assembly 300 includes a plurality of mutual capacitive sensing nodes 302 coupled to a host controller 304 via flex circuit 306. The nodes 302 may be disposed on the flexible member of the flex circuit 306 or alternatively on a printed circuit board that is attached to the flexible member of the flex circuit. The nodes 302 include a drive electrode 308 and a sense electrode 310 as described above. Although the nodes and electrodes can be arranged in accordance with any of the embodiments described above, in the illustrated embodiment the nodes and electrodes are set up similarly to FIG. 8.

The flexible member 307 of the flex circuit 306 includes a first neck 312, a landing area 314 and a second neck 316. The first neck 312 includes a plurality of traces 313 coupling the I/O contacts of the nodes 302 to corresponding I/O contacts of an input controller 318 disposed on the landing area 314 of the flex circuit 306. The input controller 318 may for example include a capacitive sensing microprocessor. In order to reduce the number of traces and I/O contacts of the input controller, the drive and sense electrodes of the nodes may be configured to share the traces that couple back to the I/O contacts of the input controller. Furthermore, in order to allow sensing, each node may include a different arrangement of drive and sense trace coupled to their corresponding electrodes. In one embodiment, the number of traces and thus the number of I/O contacts is less than the number nodes 302. In one implementation of this embodiment, the number of traces and thus the number of I/O contacts of the input controller is equal to the square root of the number of nodes 302. This is in contrast to a self capacitive device where there is typically one trace for each electrode as well as one for ground. (e.g., in the case of a sixteen electrodes, there would be seventeen traces on the first neck 312). Additional traces may be provided for other input means as for example mechanical buttons, switches, etc.

The second neck 316 includes a plurality of traces 317 coupling the I/O contacts of the input controller 318 to corresponding I/O contacts of the host controller 304. The number of lines typically depends on the communication protocol being used. By way of example, the second neck 316 may include six traces 317 for power and serial data (e.g., USB). In some cases, the flex circuit 306 is connected to the host controller 304 through a connector arrangement that utilizes pins or contacts (e.g., male/female). In this way, the touch sensing unit 302 and flex circuit 306 is a separate unit that can couple to and decouple from the host controller 304 thereby making assembly easier. In other cases, they are permanently attached thereby creating a single unit. The host controller 304 may be positioned on the flexible member of the flex circuit or alternatively on a printed circuit board such as the main board of the electronic device.

Figure 17:
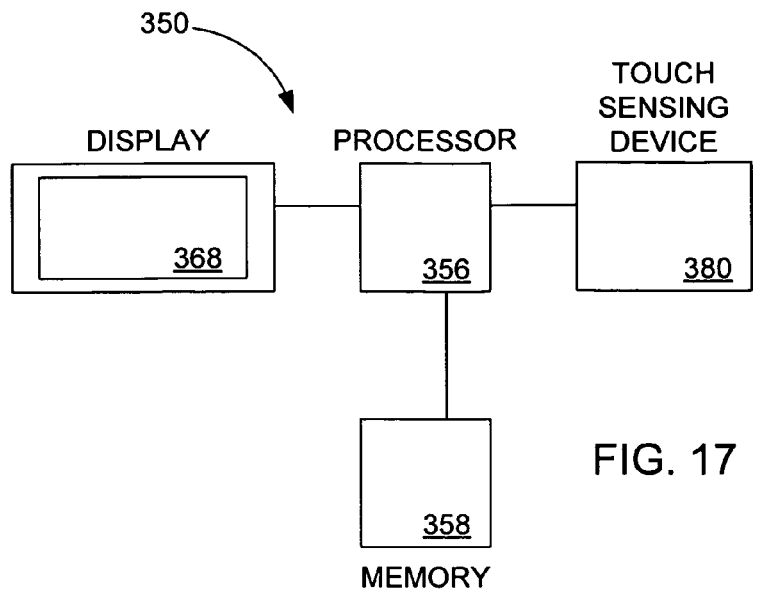
FIG. 17 is a block diagram of an exemplary electronic device, in accordance with one embodiment of the present invention.

FIG. 17 is a block diagram of an exemplary electronic device 350, in accordance with one embodiment of the present invention. The electronic device typically includes a processor 356 configured to execute instructions and to carry out operations associated with the electronic device 350. For example, using instructions retrieved for example from memory, the processor 356 may control the reception and manipulation of input and output data between components of the electronic device 350. The processor 356 can be implemented on a single-chip, multiple chips or multiple electrical components. For example, various architectures can be used for the processor 356, including dedicated or embedded processor, single purpose processor, controller, ASIC, and so forth.

In most cases, the processor 356 together with an operating system operates to execute computer code and produce and use data. The operating system may correspond to well known operating systems such as OSX, DOS, Unix, Linux, and Palm OS, or alternatively to special purpose operating system, such as those used for limited purpose appliance-type devices (e.g., media players). The operating system, other computer code and data may reside within a memory block 358 that is operatively coupled to the processor 56. Memory block 358 generally provides a place to store computer code and data that are used by the electronic device 350. By way of example, the memory block 58 may include Read-Only Memory (ROM), Random-Access Memory (RAM), hard disk drive, flash memory and/or the like.

The electronic device 350 also includes a display 368 that is operatively coupled to the processor 356. The display 368 is generally configured to display a graphical user interface (GUI) that provides an easy to use interface between a user of the electronic device 350 and the operating system or application running thereon. The display 368 may for example be a liquid crystal display (LCD).

The electronic device 350 also includes one or more touch sensing devices 380 that utilize the mutual capacitive sensing technology described herein. The one or more touch sensing devices are operatively coupled to the processor 356. The touch sensing devices 380 are configured to transfer data from the outside world into the electronic device 350. The touch sensing device 380 may for example be used to perform movements such as scrolling and to make selections with respect to the GUI on the display 368. The touch sensing device 380 may also be used to issue commands in the electronic device 350. The touch sensing devices may be selected from fixed and/or movable touch pads, touch screens and/or touch sensitive housings.

The touch sensing device 380 recognizes touches, as well as the position and magnitude of touches on a touch sensitive surface. The touch sensing device 380 reports the touches to the processor 356 and the processor 356 interprets the touches in accordance with its programming. For example, the processor 356 may initiate a task in accordance with a particular touch. Alternatively, a dedicated processor can be used to process touches locally at the touch sensing device and reduce demand for the main processor of the electronic device.

In one particular embodiment of the present invention, the electronic devices described above correspond to hand-held electronic devices with small form factors. As used herein, the term "hand held" means that the electronic device is typically operated while being held in a hand and thus the device is sized and dimension for such use. Examples of hand held devices include PDAs, Cellular Phones, Media players (e.g., music players, video players, game players), Cameras, GPS receivers, Remote Controls, and the like.

As should be appreciated, the touch sensing device can reduce the number of input devices needed to support the device and in many cases completely eliminate input devices other than the touch sensing devices. The device is therefore more aesthetically pleasing (e.g., planar smooth surfaces with limited to no breaks gaps or lines), and in many cases can be made smaller without sacrificing screen size and input functionality, which is very beneficial for hand held electronic device especially those hand held electronic device that are operated using one hand (some hand held electronic device require two handed operation while others do not).

The touch sensing devices of the present invention are a perfect fit for small form factor devices such as hand held devices, which have limited space available for input interfaces, and which require adaptable placement of input interfaces to permit operation while being carried around. This is especially true when you consider that the functionality of handheld devices have begun to merge into a single hand held device. At some point, there is not enough real estate on the device for housing all the necessary buttons and switches without decreasing the size of the display or increasing the size of the device, both of which leave a negative impression on the user. In fact, increasing the size of the device may lead to devices, which are no longer considered "hand-held."

In one particular implementation, the hand held device is a music player and the touch sensing devices are configured to generate control signals associated with a music player. For example, the touch sensing device may include list scrolling functionality, volume control functionality and button functionality including, Select, Play/Pause, Next, Previous and Menu.

Figure 18:
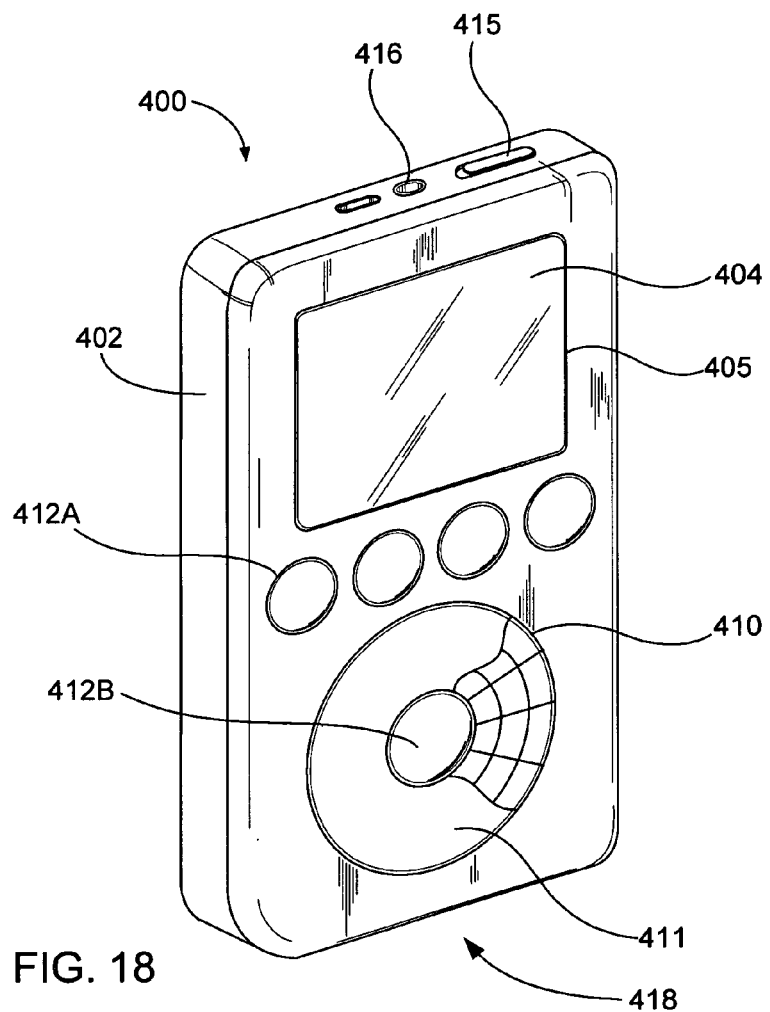
FIG. 18 is a perspective diagram of a media player, in accordance with one embodiment of the present invention.

FIG. 18 is a perspective diagram of a media player 400, in accordance with one embodiment of the present invention. The term "media player" generally refers to computing devices that are dedicated to processing media such as audio, video or other images, as for example, music players, game players, video players, video recorders, cameras and the like. These devices are generally portable so as to allow a user to listen to music, play games or video, record video or take pictures wherever the user travels. In one embodiment, the media player is a handheld device that is sized for placement into a pocket of the user. By being pocket sized, the user does not have to directly carry the device and therefore the device can be taken almost anywhere the user travels (e.g., the user is not limited by carrying a large, bulky and often heavy device, as in a portable computer).

Media players generally have connection capabilities that allow a user to upload and download data to and from a host device such as a general purpose computer (e.g., desktop computer, portable computer). For example, in the case of a camera, photo images may be downloaded to the general purpose computer for further processing (e.g., printing). With regards to music players, songs and play lists stored on the general purpose computer may be downloaded into the music player. In the illustrated embodiment, the media player 400 is a pocket sized hand held MP3 music player that allows a user to store a large collection of music. By way of example, the MP3 music player may correspond to any of those iPod music players manufactured by Apple Computer of Cupertino, Calif. (e.g., standard, mini, iShuffle, Nano, etc.).

As shown in FIG. 18, the media player 400 includes a housing 402 that encloses internally various electrical components (including integrated circuit chips and other circuitry) to provide computing operations for the media player 400. The integrated circuit chips and other circuitry may include a microprocessor, memory (e.g., ROM, RAM), a power supply (e.g., battery), a circuit board, a hard drive, and various input/output (I/O) support circuitry. In the case of music players, the electrical components may include components for outputting music such as an amplifier and a digital signal processor (DSP). In the case of video recorders or cameras the electrical components may include components for capturing images such as image sensors (e.g., charge coupled device (CCD) or complimentary oxide semiconductor (CMOS)) or optics (e.g., lenses, splitters, filters). In addition to the above, the housing may also define the shape or form of the media player. That is, the contour of the housing 402 may embody the outward physical appearance of the media player 400.

The media player 400 also includes a display screen 404. The display screen 404 is used to display a graphical user interface as well as other information to the user (e.g., text, objects, graphics). By way of example, the display screen 404 may be a liquid crystal display (LCD). As shown, the display screen 404 is visible to a user of the media player 400 through an opening 405 in the housing 402, and through a transparent wall 406 that is disposed in front of the opening 405. Although transparent, the transparent wall 406 may be considered part of the housing 402 since it helps to define the shape or form of the media player 400.

The media player 400 also includes a touch pad 410. The touch pad 410 is configured to provide one or more control functions for controlling various applications associated with the media player 400. For example, the touch initiated control function may be used to move an object or perform an action on the display screen 404 or to make selections or issue commands associated with operating the media player 400. In most cases, the touch pad 410 is arranged to receive input from a finger moving across the surface of the touch pad 110 in order to implement the touch initiated control function.

The manner in which the touch pad 410 receives input may be widely varied. In one embodiment, the touch pad 410 is configured receive input from a linear finger motion. In another embodiment, the touch pad 410 is configured receive input from a rotary or swirling finger motion. In yet another embodiment, the touch pad 410 is configured receive input from a radial finger motion. Additionally or alternatively, the touch pad 410 may be arranged to receive input from a finger tapping on the touch pad 400. By way of example, the tapping finger may initiate a control function for playing a song, opening a menu and the like.

In one embodiment, the control function corresponds to a scrolling feature. For example, in the case of an MP3 player, the moving finger may initiate a control function for scrolling through a song menu displayed on the display screen 404. The term "scrolling" as used herein generally pertains to moving displayed data or images (e.g., text or graphics) across a viewing area on a display screen 404 so that a new set of data (e.g., line of text or graphics) is brought into view in the viewing area. In most cases, once the viewing area is full, each new set of data appears at the edge of the viewing area and all other sets of data move over one position. That is, the new set of data appears for each set of data that moves out of the viewing area. In essence, the scrolling function allows a user to view consecutive sets of data currently outside of the viewing area. The viewing area may be the entire viewing area of the display screen 104 or it may only be a portion of the display screen 404 (e.g., a window frame).

The direction of scrolling may be widely varied. For example, scrolling may be implemented vertically (up or down) or horizontally (left or right). In the case of vertical scrolling, when a user scrolls down, each new set of data appears at the bottom of the viewing area and all other sets of data move up one position. If the viewing area is full, the top set of data moves out of the viewing area. Similarly, when a user scrolls up, each new set of data appears at the top of the viewing area and all other sets of data move down one position. If the viewing area is full, the bottom set of data moves out of the viewing area. In one implementation, the scrolling feature may be used to move a Graphical User Interface (GUI) vertically (up and down), or horizontally (left and right) in order to bring more data into view on a display screen. By way of example, in the case of an MP3 player, the scrolling feature may be used to help browse through songs stored in the MP3 player. The direction that the finger moves may be arranged to control the direction of scrolling. For example, the touch pad may be arranged to move the GUI vertically up when the finger is moved in a first direction and vertically down when the finger is moved in a second direction To elaborate, the display screen 404, during operation, may display a list of media items (e.g., songs). A user of the media player 400 is able to linearly scroll through the list of media items by moving his or her finger across the touch pad 410. As the finger moves around the touch pad 410, the displayed items from the list of media items are varied such that the user is able to effectively scroll through the list of media items. However, since the list of media items can be rather lengthy, the invention provides the ability for the user to rapidly traverse (or scroll) through the list of media items. In effect, the user is able to accelerate their traversal of the list of media items by moving his or her finger at greater speeds.

In one embodiment, the media player 400 via the touch pad 410 is configured to transform a swirling or whirling motion of a finger into translational or linear motion, as in scrolling, on the display screen 404. In this embodiment, the touch pad 410 is configured to determine the angular location, direction, speed and acceleration of the finger when the finger is moved across the top planar surface of the touch pad 410 in a rotating manner, and to transform this information into signals that initiate linear scrolling on the display screen 404. In another embodiment, the media player 400 via the touch pad 410 is configured to transform radial motion of a finger into translational or linear motion, as in scrolling, on the display screen 404. In this embodiment, the touch pad 410 is configured to determine the radial location, direction, speed and acceleration of the finger when the finger is moved across the top planar surface of the touch pad 410 in a radial manner, and to transform this information into signals that initiate linear scrolling on the display screen 404. In another embodiment, the media player 400 via the touch pad 410 is configured to transform both angular and radial motion of a finger into translational or linear motion, as in scrolling, on the display screen 404.

The touch pad generally consists of a touchable outer surface 411 for receiving a finger for manipulation on the touch pad 410. Although not shown in FIG. 20, beneath the touchable outer surface 411 is a sensor arrangement. The sensor arrangement includes a plurality of sensors that are configured to activate as the finger performs an action over them. In the simplest case, an electrical signal is produced each time the finger passes a sensor. The number of signals in a given time frame may indicate location, direction, speed and acceleration of the finger on the touch pad, i.e., the more signals, the more the user moved his or her finger. In most cases, the signals are monitored by an electronic interface that converts the number, combination and frequency of the signals into location, direction, speed and acceleration information. This information may then be used by the media player 400 to perform the desired control function on the display screen 404. By way of example, the sensor arrangement may correspond to any of those described herein.

The position of the touch pad 410 relative to the housing 402 may be widely varied. For example, the touch pad 410 may be placed at any external surface (e.g., top, side, front, or back) of the housing 402 that is accessible to a user during manipulation of the media player 400. In most cases, the touch sensitive surface 411 of the touch pad 410 is completely exposed to the user. In the illustrated embodiment, the touch pad 410 is located in a lower, front area of the housing 402.

Furthermore, the touch pad 410 may be recessed below, level with, or extend above the surface of the housing 402. In the illustrated embodiment, the touch sensitive surface 411 of the touch pad 410 is substantially flush with the external surface of the housing 402.

The shape of the touch pad 410 may also be widely varied. For example, the touch pad 410 may be circular, rectangular, triangular, and the like. In general, the outer perimeter of the shaped touch pad defines the working boundary of the touch pad. In the illustrated embodiment, the touch pad 410 is circular. Circular touch pads allow a user to continuously swirl a finger in a free manner, i.e., the finger can be rotated through 360 degrees of rotation without stopping. Furthermore, the user can rotate his or her finger tangentially from all sides thus giving it more range of finger positions. For example, when the media player is being held, a left handed user may choose to use one portion of the touch pad 410 while a right handed user may choose to use another portion of the touch pad 410. More particularly, the touch pad is annular, i.e., shaped like or forming a ring. When annular, the inner and outer perimeter of the shaped touch pad defines the working boundary of the touch pad.

In addition to above, the media player 400 may also include one or more buttons 412. The buttons 412 are configured to provide one or more dedicated control functions for making selections or issuing commands associated with operating the media player 400. By way of example, in the case of an MP3 music player, the button functions may be associated with opening a menu, playing a song, fast forwarding a song, seeking through a menu and the like. The button functions are implemented via a mechanical clicking action or alternatively via a sensor arrangement such as those described herein. The position of the buttons 412 relative to the touch pad 410 may be widely varied. For example, they may be adjacent one another or spaced apart. In the illustrated embodiment, the buttons 412 are separated from the touch pad 410 (see for example FIG. 14). As shown, there are four buttons 412A in a side by side relationship above the touch pad 410 and one button 412B disposed in the center or middle of the touch pad 410. By way of example, the plurality of buttons 412 may consist of a menu button, play/stop button, forward seek button and a reverse seek button, select button (enter) and the like. Alternatively or additionally, the buttons may be implemented with a movable touch pad.

Moreover, the media player 400 may also include a hold switch 414, a headphone jack 416 and a data port 418. The hold switch 414 is configured to turn the input devices of the media device 400 on and off. The headphone jack 416 is capable of receiving a headphone connector associated with headphones configured for listening to sound being outputted by the media device 400. The data port 418 is capable of receiving a data connector/cable assembly configured for transmitting and receiving data to and from a host device such as a general purpose computer. By way of example, the data port 418 may be used to upload or down load songs to and from the media device 400. The data port 418 may be widely varied. For example, the data port may be a PS/2 port, a serial port, a parallel port, a USB port, a Firewire port and the like. In some cases, the data port 118 may be a radio frequency (RF) link or optical infrared (IR) link to eliminate the need for a cable. Although not shown in FIG. 20, the media player 400 may also include a power port that receives a power connector/cable assembly configured for delivering powering to the media player 400. In some cases, the data port 418 may serve as both a data and power port.

In any of the embodiments described or contemplated by this specification, the touch sensing devices may be configured to provide visual information to indicate when and where the touches occur, to invoke a touch (location where a user should touch), or as otherwise programmed. In the case of a touch screen, the visual information may be provided by the graphical display positioned behind the touch screen. In the case of the touch sensitive housing, or touch pad (or possibly with the touch screen), this may be accomplished with a visual feedback system that is capable of adjusting the visual stimuli of the touch surface.

The visual feedback system may include visual surface changing elements, which can be separate or integral with the sensing elements. In fact, the visual surface changing elements may be mapped to the sensor coordinates such that particular visual surface changing elements are tied to particular sensor coordinates. By way of example, the visual surface changing elements may be light devices such as light emitting diodes that illuminate the touch surface. For example, the light devices may be positioned in an array or matrix similarly to the sensing devices. Alternatively, the visual surface changing elements may be embodied as electronic inks or other color changing surfaces.

If used, this visual feedback feature allows the display of pop-up buttons, characters, and indicators around the touch surface, which can disappear when not in use or required, or glowing special effects that trace or outline a users fingers in contact with the touch surface, or otherwise provide visual feedback for the users of the device. In one implementation, the handheld device is configured to sense one or more touches and provide visual feedback in the area of the touches. In another implementation, the handheld device is configured to provide visual feedback on the touch surface, detect a touch in the area of the visual feedback, and to perform an action that is associated with the visual feedback. An example of such an arrangement can be found in U.S. patent application Ser. No. 11/394,493, which is herein incorporated by reference.

While this invention has been described in terms of several preferred embodiments, there are alterations, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A touch sensing device, comprising:
a mutual capacitive sensing controller having a plurality of distinct drive lines and a plurality of distinct sense lines, a source for driving a current or voltage separately though each drive line, a mutual capacitance sensing circuit that monitors the capacitance at the sensing lines;
a plurality of independent and spatially distinct mutual capacitive sensing nodes set up in a non two dimensional array, each node including a drive electrode that is spatially separated from a sense electrode, the drive electrode and the sense electrode being configured to capacitively couple a drive line and a sense line,
the plurality of drive lines configured to carry current from the controller to the nodes,
the plurality of sense lines configured to carry current from the plurality of nodes to the controller,
wherein the nodes comprise multiple node groups, at least a first of the node groups comprising multiple nodes, each node in a node group being associated with a sense line that is common to all nodes in the group and a drive line that is not common to any other node in the group, one node in each node group being associated with a drive line that is common to all node groups.

2. The touch sensing device as recited in claim 1 wherein the nodes are positioned next to one another in succession along a prescribed path.

3. The touch sensing device as recited in claim 2 wherein the nodes form a linear path.

4. The touch sensing device as recited in claim 2 wherein the nodes form a circular path.

5. The touch sensing device as recited in claim 4 wherein the nodes represent angular input areas disposed around a circle.

6. The touch sensing device as recited in claim 2 wherein the nodes are placed in an open loop arrangement.

7. The touch sensing device as recited in claim 2 wherein the nodes are placed in a closed loop arrangement.

8. The touch sensing device as recited in claim 1 wherein a portion of the nodes form a scrolling region.

9. The touch sensing device as recited in claim 1 wherein a portion of the nodes form buttons that represent distinct button functions.

10. The touch sensing device as recited in claim 1 further including a filter that rejects parasitic capacitance effects so that a clean representation of the charge transferred across the node is outputted.

11. The touch sensing device as recited in 1 wherein the nodes include a cover film, an electrode layer and a substrate, the cover film being disposed over the electrode layer, the electrode layer being disposed over the substrate, the electrode layer including the drive and sense electrodes.

12. The touch sensing device as recited in 1 wherein the drive and sense electrodes are juxtaposed plates.

13. The touch sensing device as recited in 1 wherein the drive and sense electrode are interleaved with one another.

14. The touch sensing device as recited in 1 further including a floating electrode disposed over and spatially separated from the electrode pair of the node.

15. The touch sensing device as recited in 1 wherein the mutual capacitance sensing circuit continuously monitors all the sensing lines at the same time.

16. The touch sensing device as recited in 1 wherein the mutual capacitance sensing circuit monitors all the sensing lines sequentially.

17. The touch sensing device as recited in 1 wherein the number of nodes is equal to the number of drive lines multiplied by the number of sense lines.

18. The touch sensing device as recited in 17 wherein the number of drive lines is equal to the number of sense lines.

19. The touch sensing device as recited in 17 wherein the number of drive lines is different than the number of sense lines.

20. The touch sensing device as recited in 1 wherein the number of nodes is less than the number of drive lines multiplied by the number of sense lines.

21. A mutual capacitive sensing method, comprising:
separately driving a voltage or current through each of multiple drive lines;
capacitively coupling current between mutual capacitive sensing nodes comprising drive electrodes that are coupled to the driven drive line and corresponding sense electrodes that are coupled to different sense lines,
the nodes forming multiple node groups, each of the multiple groups comprising multiple nodes, each node in a group being associated with a sense line that is common to all nodes in the group and a drive line that is not common to any other node in the group, one node in each group being associated with a drive line that is common to all groups, detecting with a mutual capacitance sensing circuit capacitance at drive and sense electrode pairs through each sense line each time a drive line is driven;

determining which electrode pairs have been touched based on detected capacitance; and performing actions based on which electrode pairs have been touched.

22. The method as recited in claim 21 further including filtering parasitic capacitance created by non driven electrode pairs.

23. A touch sensing device that operates via mutual capacitance, comprising:

multiple mutual capacitance sensing nodes, each mutual capacitance sensing node including a drive electrode that is spatially separated and juxtaposed next to a sense electrode, the drive electrode being coupled to a drive line and the sense electrode being coupled to a sense line of a mutual capacitance sensing circuit, and a floating electrode disposed over and spatially separated from the drive electrode and the sense electrode, the nodes being arranged in multiple groups, each of the multiple groups comprising multiple nodes, each node in a group being associated with a sense line that is common to all nodes in the group and a drive line that is not common to any other node in the group, one node in each group being associated with a drive line that is common to all groups.

24. A mutual capacitance touch sensing device, comprising:

a plurality of mutual capacitance sensing nodes arranged in a non 2D array and coupled to drive lines and sense lines, each node comprising an electrode pair of drive electrode and sense electrode configured to capacitively couple a drive line and a sense line, at least one of the drive lines configured to carry a current to the drive electrode of the node, and at least one of the sense lines configured to carry a current from the sense electrode of the node to a mutual capacitance sensing circuit indicating a change in capacitance at the node, the nodes comprising node groups, each node in a node group being associated with a sense line that is common to all nodes in the group and a drive line that is not common to any other node in the group, one node in each node group being associated with a drive line that is common to all node groups.

25. The mutual capacitance touch sensing device of claim 24, wherein each node in a node group comprises a drive electrode coupled to different ones of the drive lines and a sense electrode coupled to a same one of the sense lines, and each node group comprises a node coupled to a same one of the drive lines.

26. A touch sensing device comprising:

a controller, multiple nodes, multiple drive lines configured to carry current from the controller to the nodes, multiple sense lines configured to carry current from the multiple nodes to the controller, each of the multiple nodes comprising a drive electrode and a sense electrode, the drive electrode and the sense electrode being configured to capacitively couple a drive line and a sense line, the nodes being arranged in multiple groups, each of the multiple groups comprising multiple nodes, each node in a group being associated with a sense line that is common to all nodes in the group and a drive line that is not common to any other node in the group, one node in each group being associated with a drive line that is common to all groups.

27. A touch sensing device, comprising:

a mutual capacitive sensing controller having a plurality of distinct drive lines and a plurality of distinct sense lines, a source for driving a current or voltage separately though each drive line, a mutual capacitance sensing circuit that monitors the capacitance at the sensing lines;

a plurality of independent and spatially distinct mutual capacitive sensing nodes set up in a non two dimensional array, each node including a drive electrode that is spatially separated from a sense electrode, the drive electrode and the sense electrode being configured to capacitively couple a drive line and a sense line, the plurality of drive lines configured to carry current from the controller to the nodes, the plurality of sense lines configured to carry current from the plurality of nodes to the controller, wherein the nodes comprise multiple adjacent node groups, at least a first of the adjacent node groups comprising multiple nodes, each node in a node group being associated with a sense line that is common to all nodes in the group and a drive line that is not common to any other node in the group, one node in each node group being associated with a drive line that is common to all node groups.

28. A touch sensing device comprising:

a controller, multiple nodes, multiple drive lines configured to carry current from the controller to the nodes, multiple sense lines configured to carry current from the multiple nodes to the controller, each of the multiple nodes comprising a drive electrode and a sense electrode, the drive electrode and the sense electrode being configured to capacitively couple a drive line and a sense line, the nodes being arranged in multiple adjacent groups, each of the multiple adjacent groups comprising multiple nodes, each node in a group being associated with a sense line that is common to all nodes in the group and a drive line that is not common to any other node in the group, one node in each group being associated with a drive line that is common to all groups.

* * * * *